(12) United States Patent
Cho et al.

(10) Patent No.: US 12,408,323 B2
(45) Date of Patent: Sep. 2, 2025

(54) SEMICONDUCTOR MEMORY DEVICE AND METHOD FOR MANUFACTURING THE SAME

(71) Applicant: Samsung Electronics Co., Ltd., Suwon-si (KR)

(72) Inventors: Seongkeun Cho, Suwon-si (KR); Hee Young Park, Hwaseong-si (KR); Jin Hyung Park, Bucheon-si (KR); Kun Tack Lee, Suwon-si (KR); Jung Hyuk Jang, Suwon-si (KR); Chun Hyung Chung, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 398 days.

(21) Appl. No.: 18/049,732

(22) Filed: Oct. 26, 2022

(65) Prior Publication Data
US 2023/0128492 A1    Apr. 27, 2023

(30) Foreign Application Priority Data
Oct. 26, 2021 (KR) .................. 10-2021-0143385

(51) Int. Cl.
*H10B 12/00* (2023.01)

(52) U.S. Cl.
CPC .......... *H10B 12/315* (2023.02); *H10B 12/50* (2023.02)

(58) Field of Classification Search
None
See application file for complete search history.

(56) References Cited

U.S. PATENT DOCUMENTS

| | | | |
|---|---|---|---|
| 6,916,690 | B2 | 7/2005 | Chang |
| 7,901,974 | B2 | 3/2011 | Venezia et al. |
| 8,158,486 | B2 | 4/2012 | Van Bentum et al. |
| 8,278,690 | B2 | 10/2012 | Mao et al. |

(Continued)

FOREIGN PATENT DOCUMENTS

| | | |
|---|---|---|
| JP | 2013-16707 A | 1/2013 |
| KR | 10-2011-0062414 A | 6/2011 |
| KR | 10-2021-0049231 A | 5/2021 |

OTHER PUBLICATIONS

Korean Office Action dated Jun. 23, 2025 issued in Korean Patent Application No. 10-2021-0143385.

*Primary Examiner* — Steven M Page
(74) *Attorney, Agent, or Firm* — Harness, Dickey & Pierce, P.L.C.

(57) ABSTRACT

There is provided a semiconductor memory device capable of improving the performance and/or the reliability of a device. The semiconductor memory device includes a substrate having a cell area and a peripheral area defined along a periphery of the cell area, wherein the cell area includes an active area defined by a cell element separation film, a cell area separation film in the substrate and defining the cell area, and a plurality of storage contacts connected to the active area, and arranged along a first direction. The plurality of storage contacts includes a first storage contact, a second storage contact, and a third storage contact, wherein the second storage contact is between the first storage contact and the third storage contact, each of the first storage contact and the third storage contact contains or surrounds or defines an airgap, and the second storage contact is free of an airgap.

20 Claims, 38 Drawing Sheets

(56) References Cited

U.S. PATENT DOCUMENTS

| | | | |
|---|---|---|---|
| 8,921,220 B2 | 12/2014 | Wenxu et al. | |
| 2019/0296019 A1* | 9/2019 | Wu | H10B 12/50 |
| 2021/0098632 A1 | 4/2021 | Duriez et al. | |
| 2022/0310624 A1* | 9/2022 | Lu | H10B 12/0335 |
| 2022/0320104 A1* | 10/2022 | Zhu | H10B 12/315 |

* cited by examiner

SEMICONDUCTOR MEMORY DEVICE AND METHOD FOR MANUFACTURING THE SAME

CROSS-REFERENCE TO RELATED APPLICATION

This application claims priority from Korean Patent Application No. 10-2021-0143385 filed on Oct. 26, 2021 in the Korean Intellectual Property Office, and all the benefits accruing therefrom under 35 U.S.C. § 119, the contents of which in its entirety are herein incorporated by reference.

BACKGROUND

Some example embodiments relate to a semiconductor memory device and/or a method for manufacturing the same, and more specifically, to a semiconductor memory device having a plurality of wire lines intersecting with each other and buried contacts, and/or a method for manufacturing the same.

A semiconductor device has an increasingly higher integration level. Thus, in order to implement more semiconductor elements in the same area, individual circuit patterns are increasingly made smaller. For example, as the integration level of the semiconductor memory device increases, a design rule for components of the semiconductor memory device is decreasing.

In a highly scaled semiconductor device, a process of forming a plurality of wire lines and a plurality of buried contacts (BC) interposed between the lines is becoming increasingly complex and/or difficult.

SUMMARY

Some example embodiments provide a semiconductor memory device that may have improved reliability and/or performance.

Alternatively or additionally, some example embodiments provide a method for manufacturing a semiconductor memory device that may have improved reliability and/or performance Example embodiments are not limited to the above-mentioned purpose. Other purposes and advantages in accordance with various example embodiments as not mentioned above may be understood from following descriptions and more clearly understood from example embodiments in accordance with inventive concepts. Further, it will be readily appreciated that the purposes and/or advantages in accordance with various example embodiments may be realized by features and combinations thereof as disclosed in the claims.

According to some example embodiments, there is provided a semiconductor memory device comprising a substrate having a cell area and a peripheral area defined along a periphery of the cell area, wherein the cell area includes an active area defined by a cell element separation film, a cell area separation film in the substrate and defining the cell area, and a plurality of storage contacts connected to the active area, and arranged along a first direction, wherein the plurality of storage contacts includes a first storage contact, a second storage contact, and a third storage contact, wherein the second storage contact is between the first storage contact and the third storage contact, each of the first storage contact and the third storage contact defines an airgap, and the second storage contact does not define or surround an airgap.

Alternatively or additionally, there is provided a semiconductor memory device comprising a substrate having a cell area and a peripheral area defined along a periphery of the cell area, wherein the cell area includes an active area defined by a cell element separation film, a cell area separation film in the substrate and defining the cell area, a plurality of bit-line contacts connected to the active area and arranged along a first direction, and a bit-line disposed on the plurality of bit-line contacts, and extending in the first direction, wherein the plurality of bit-line contacts include a first bit-line contact, a second bit-line contact, and a third bit-line contact, wherein the second bit-line contact is between the first bit-line contact and the third bit-line contact, wherein an airgap is defined between the first bit-line contact and the bit-line, and between the third bit-line contact and the bit-line, and wherein no airgap is defined between the second bit-line contact and the bit-line.

Alternatively or additionally, there is provided a semiconductor memory device comprising a substrate having a cell area and a peripheral area defined along a periphery of the cell area, wherein the cell area includes an active area defined by a cell element separation film, a cell area separation film in the substrate and defining the cell area, a normal bit-line on the cell area and extending in a first direction, a group of dummy bit-lines disposed on the cell area and on one side of the normal bit-line, and a plurality of storage contacts connected to the active area and arranged along a second direction perpendicular to the first direction, wherein the group of dummy bit-lines includes a first dummy bit-line closest to the peripheral area in the second direction, and a second dummy bit-line closest to the first dummy bit-line in the second direction, wherein the first dummy bit-line extends in the first direction and has a first width in the second direction, the second dummy bit-line extends in the first direction and has a second width in the second direction, and a ratio of the first width to the second width is greater than or equal to 1 and is less than or equal to 2.

Alternatively or additionally, there is provided a method for manufacturing a semiconductor memory device comprising forming a cell area separation film and a cell element separation film in a substrate, wherein the cell area separation film separates a cell area and a peripheral area from each other, and the cell element separation film defines an active area in the cell area, forming a plurality of bit-lines on the cell area and extending in a first direction, wherein the bit-lines are spaced apart from each other in a second direction perpendicular to the first direction, forming a first semiconductor material film on the substrate so as to cover the plurality of bit-lines, forming a reflective film on the first semiconductor material film so as to overlap the peripheral area in a third direction, wherein the reflective film is includes an insulating material, and the third direction is perpendicular to the first direction and the second direction, performing a laser annealing process using the reflective film to recrystallize the first semiconductor material film to form a second semiconductor material film, and after removing the reflective film, patterning the second semiconductor material film to form a storage contact connected to the active area, wherein at least a portion of the cell area do not overlap the reflective film in the third direction.

Alternatively or additionally, there is provided a method for manufacturing a semiconductor memory device comprising forming a cell area separation film and a cell element separation film in a substrate, wherein the cell area separation film separates a cell area and a peripheral area from each other, and the cell element separation film defines an active area in the cell area, forming a plurality of bit-lines disposed on the cell area and extending in a first direction, wherein the bit-lines are spaced apart from each other in a second direction perpendicular to the first direction, forming a first semiconductor material film on the substrate so as to cover the plurality of bit-lines, forming an anti-reflective film on the first semiconductor material film so as to overlap the cell area in a third direction, wherein the anti-reflective film includes an insulating material, and the third direction is perpendicular to the first direction and the second direction, performing a laser annealing process using the anti-reflective film to recrystallize the first semiconductor material film to form a second semiconductor material film, and after removing the anti-reflective film, patterning the second semiconductor material film to form a storage contact connected to the active area.

BRIEF DESCRIPTION OF DRAWINGS

The above and other aspects and features of various example embodiments will become more apparent by describing in detail embodiments thereof with reference to the attached drawings, in which.

DETAILED DESCRIPTION OF VARIOUS EXAMPLE EMBODIMENTS

Figure 1:
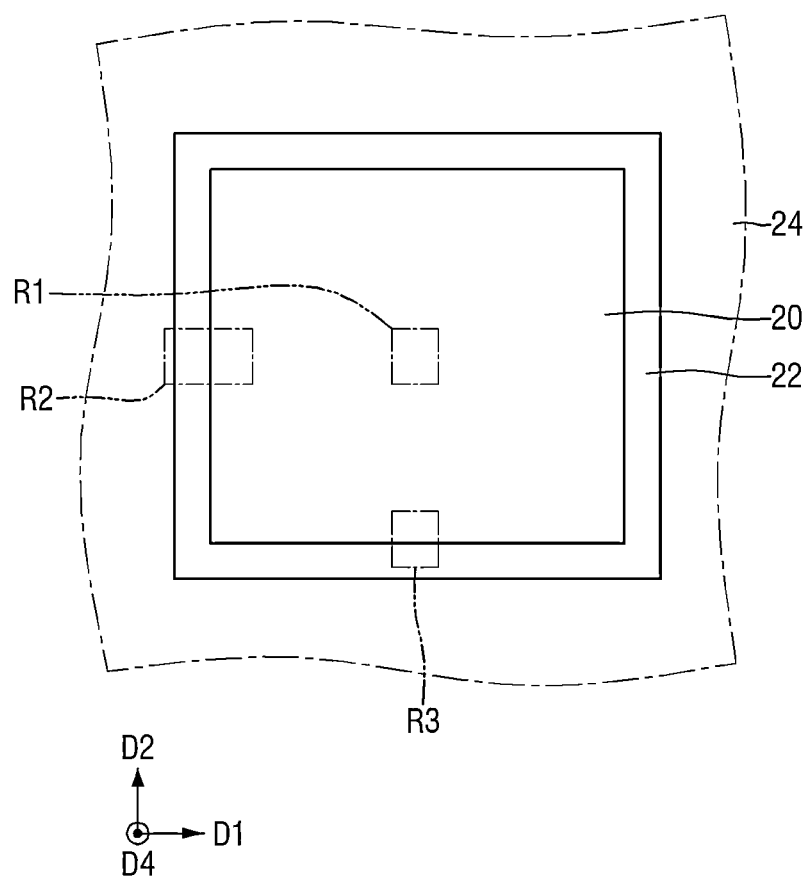
FIG. 1 is a schematic layout of a semiconductor memory device according to some example embodiments.
Figure 2:
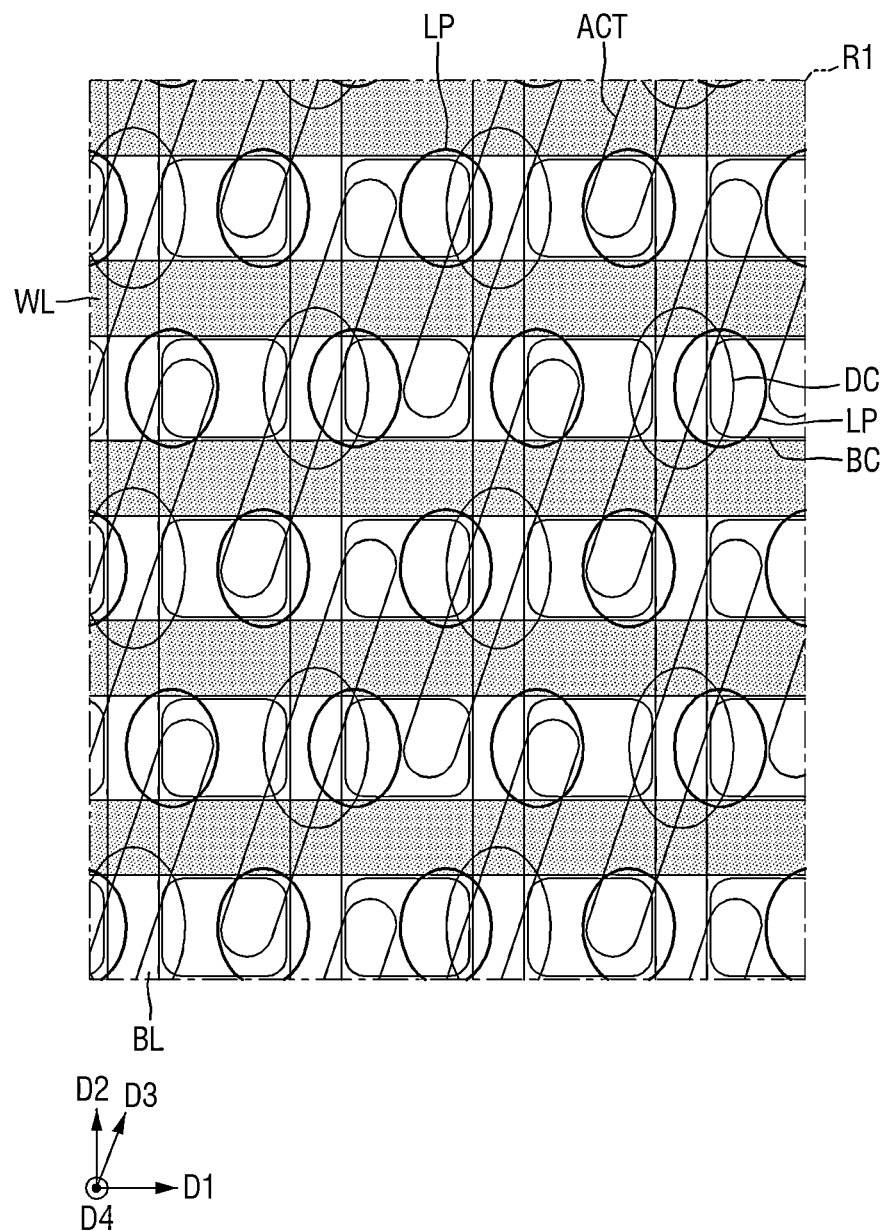
FIG. 2 is an enlarged schematic layout of a R1 portion of FIG. 1.
Figure 3:
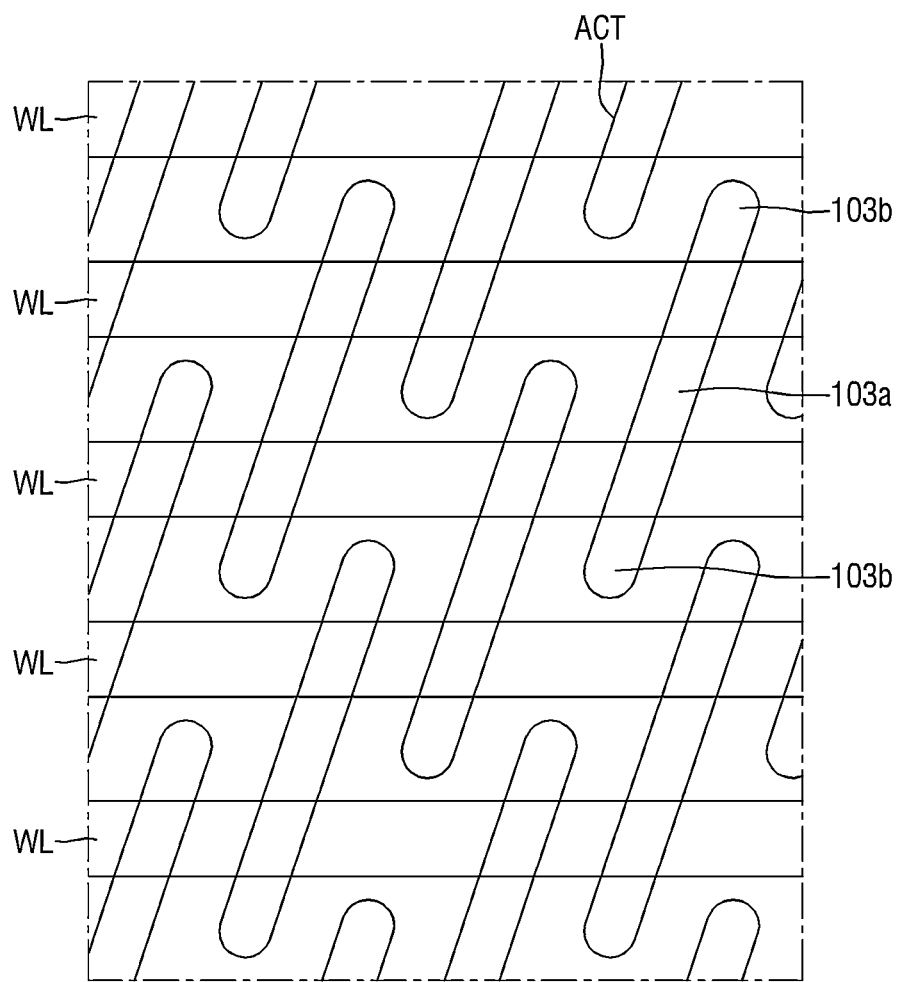
FIG. 3 is a layout showing only a word-line and an active area of FIG. 2.
Figure 3:
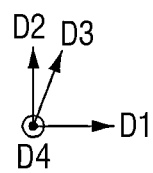
Figure 4:
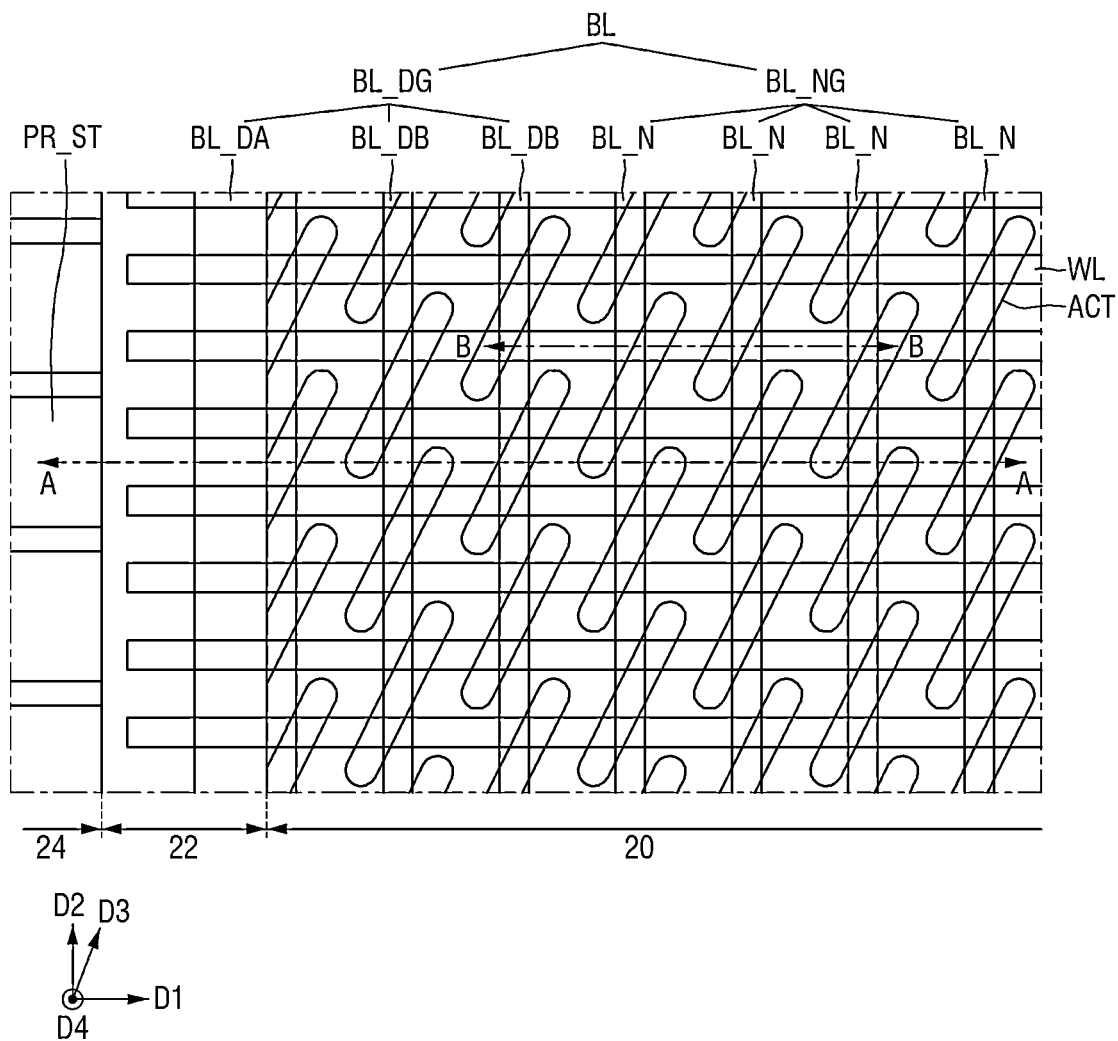
FIG. 4 is a schematic layout diagram of a R2 area of FIG. 1.
Figure 5:
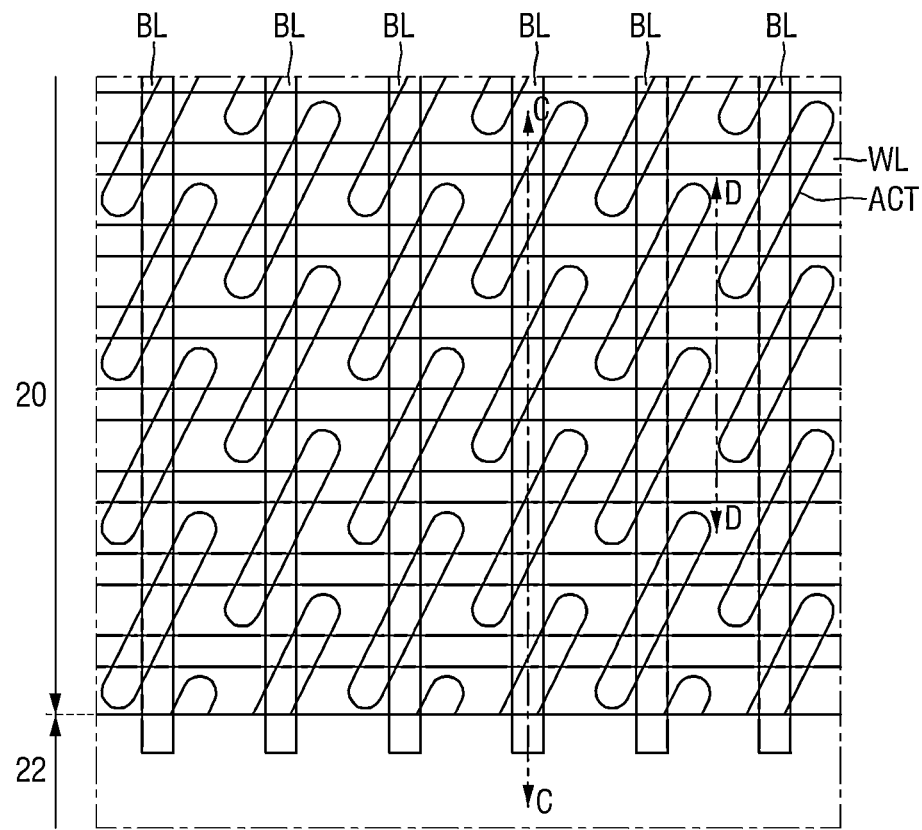
FIG. 5 is a schematic layout diagram of a R3 area of FIG. 1.
Figure 5:
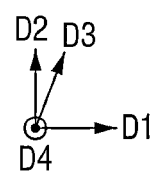
Figure 6:
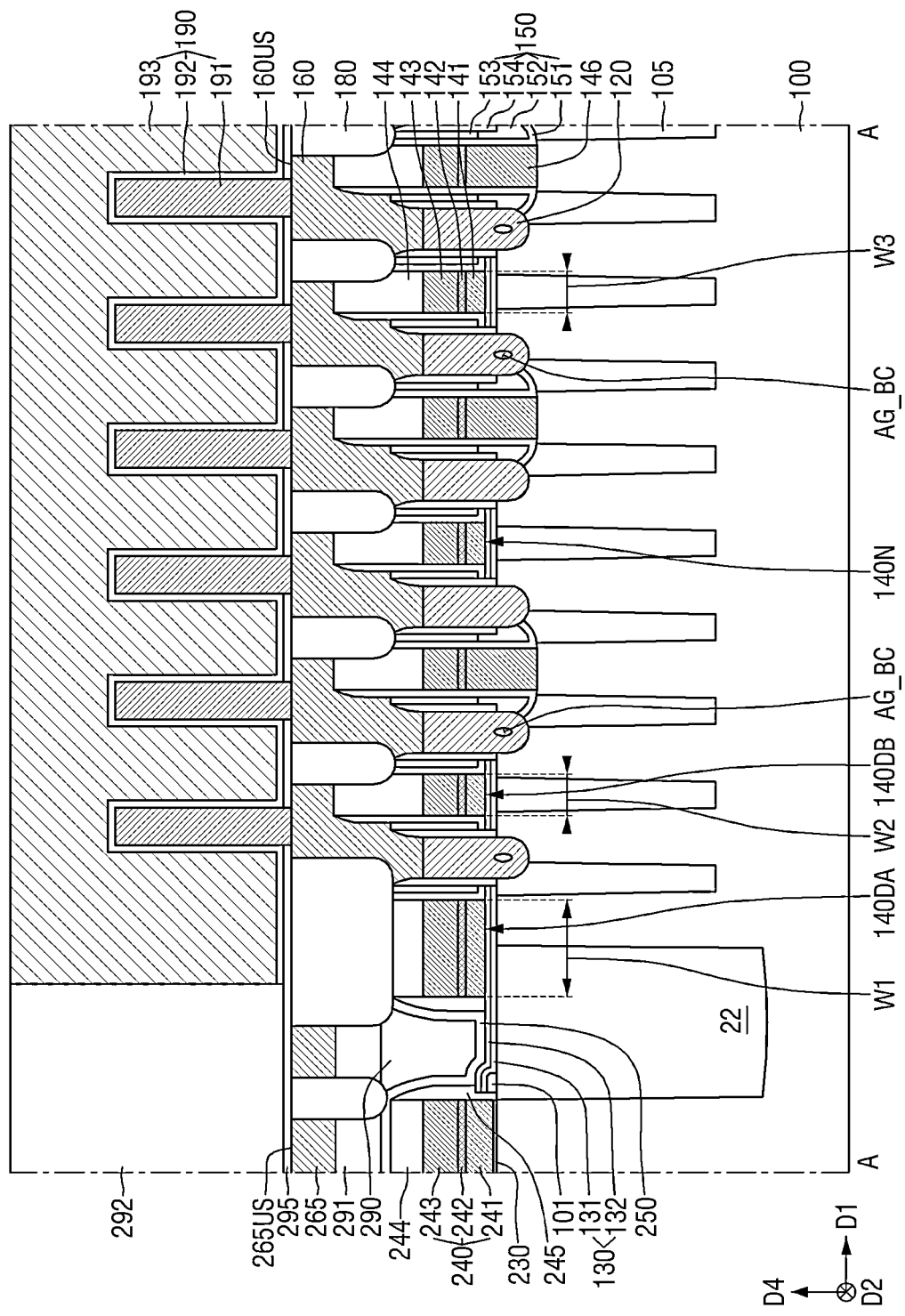
FIG. 6 is an example cross-sectional view taken along A-A of FIG. 4.
Figure 7:
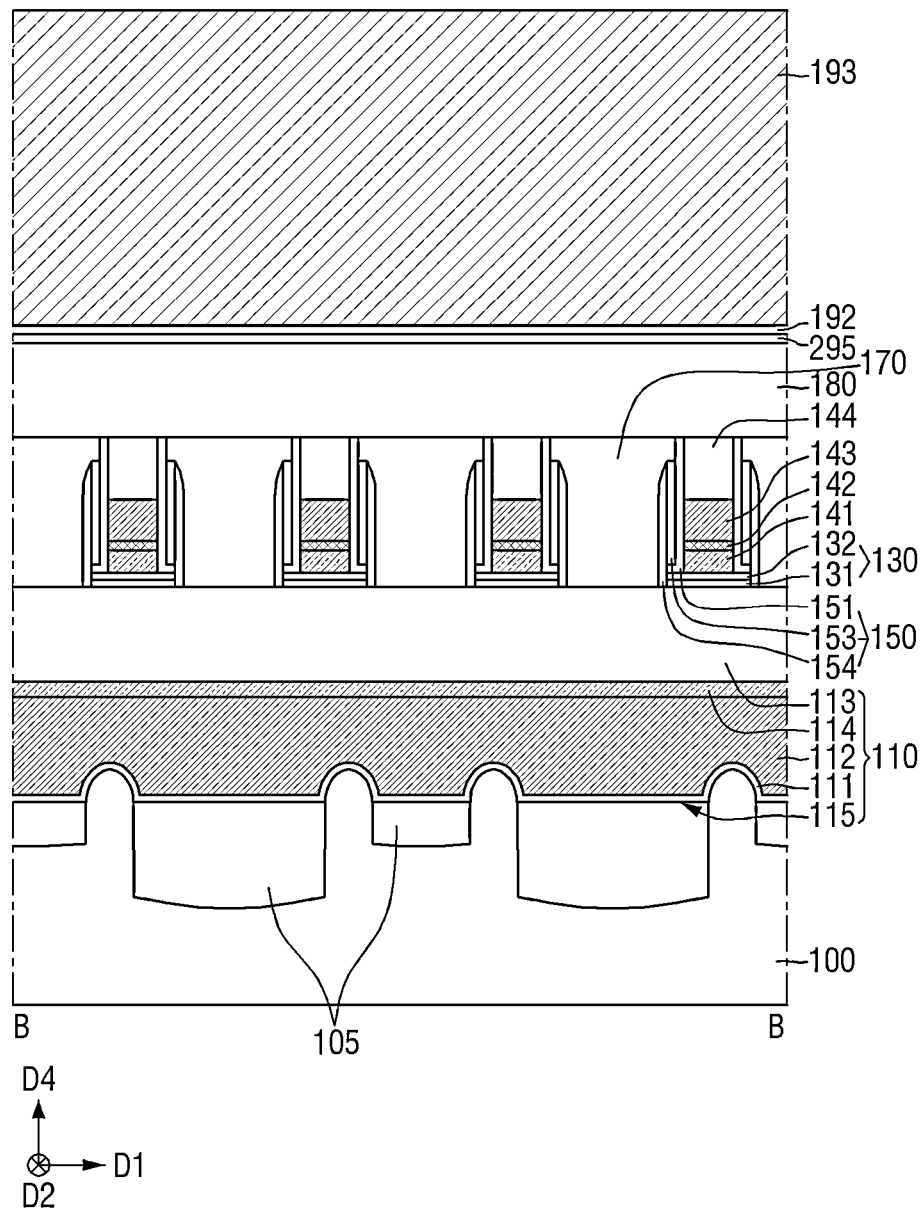
FIG. 7 is an example cross-sectional view taken along B-B of FIG. 4.
Figure 8:
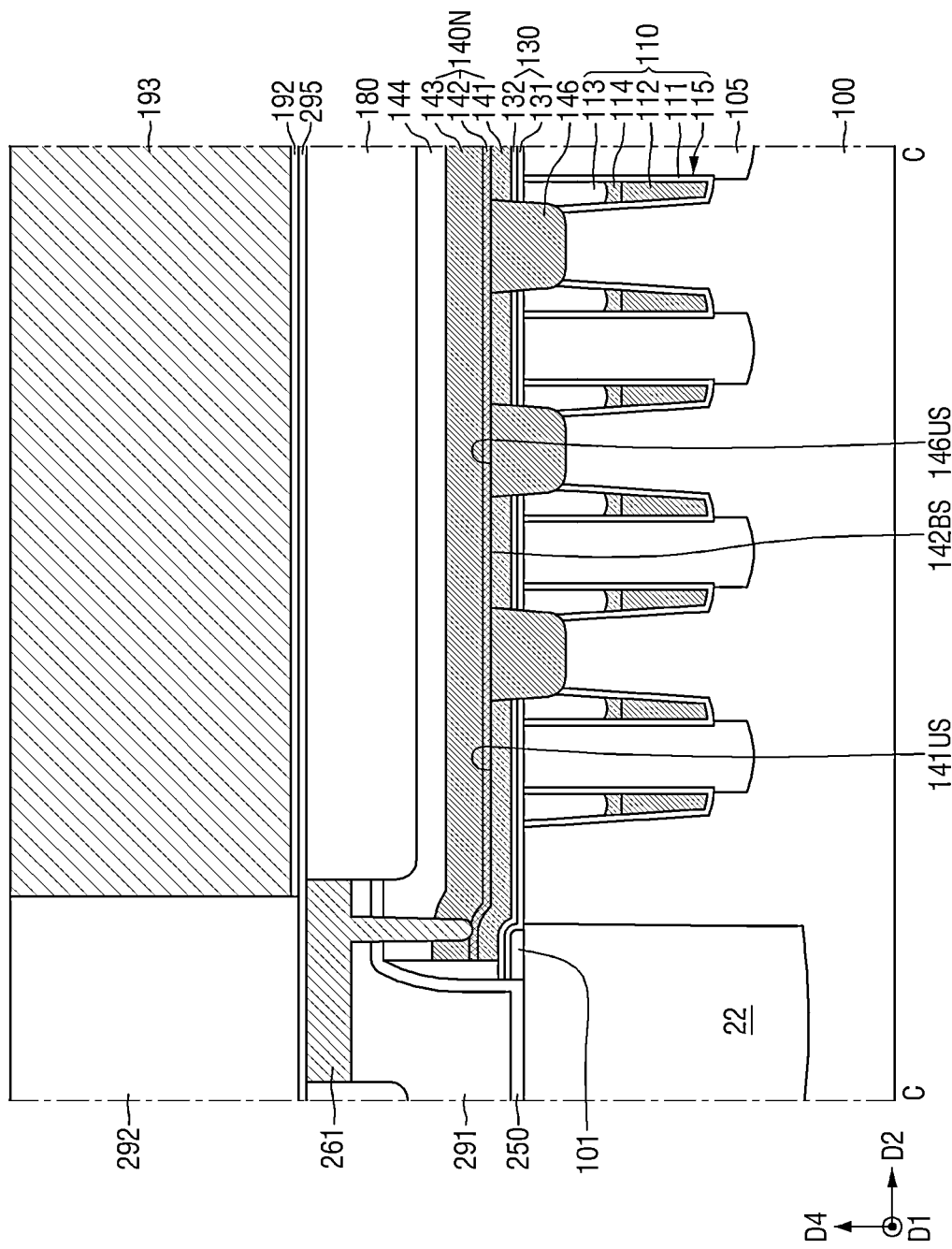
FIG. 8 is an example cross-sectional view taken along C-C of FIG. 5.
Figure 9:
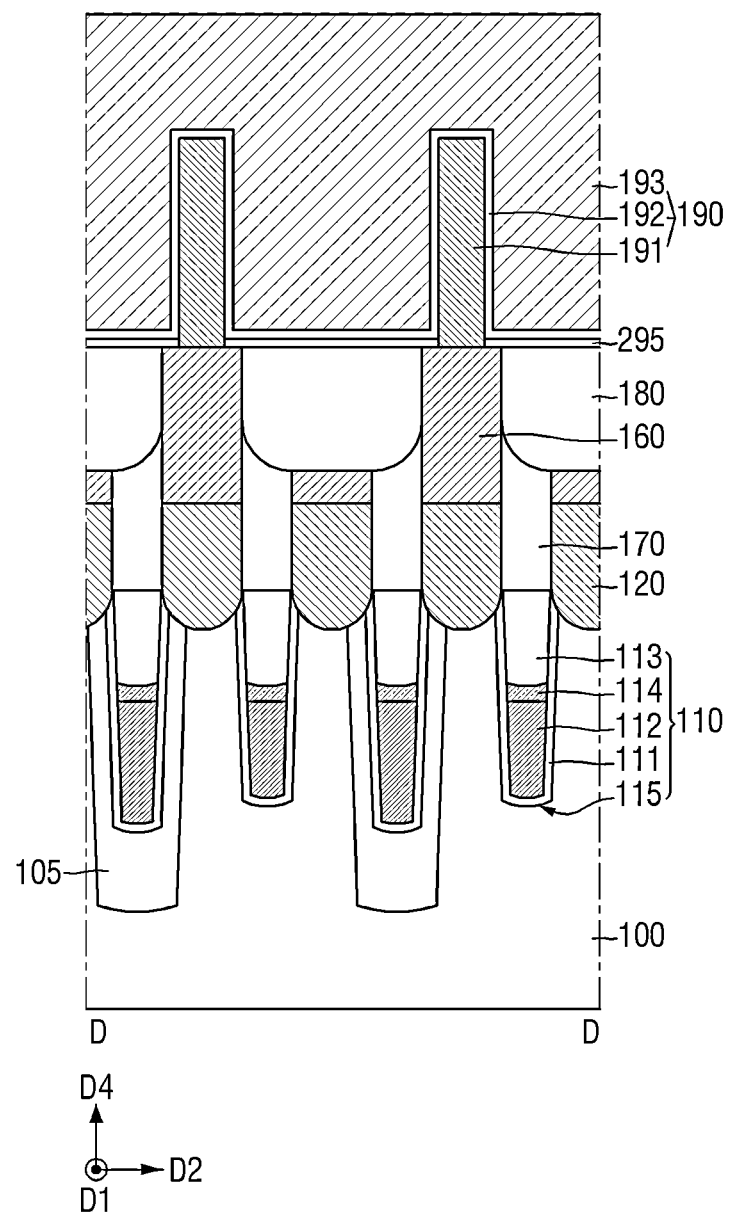
FIG. 9 is an example cross-sectional view taken along D-D of FIG. 5.

FIG. 1 is a schematic layout of a semiconductor memory device according to some example embodiments. FIG. 2 is an enlarged schematic layout of a R1 portion of FIG. 1. FIG. 3 is a layout showing only a word-line and an active area of FIG. 2. FIG. 4 is a schematic layout diagram of a R2 area of FIG. 1. FIG. 5 is a schematic layout diagram of a R3 area of FIG. 1. FIG. 6 is an example cross-sectional view taken along A-A of FIG. 4. FIG. 7 is an example cross-sectional view taken along B-B of FIG. 4. FIG. 8 is an example cross-sectional view taken along C-C of FIG. 5. FIG. 9 is an example cross-sectional view taken along D-D of FIG. 5.

In a diagram of a semiconductor memory device according to some example embodiments, a DRAM (Dynamic Random Access Memory) is illustrated by way of example. However, example embodiments are not limited thereto, and the semiconductor memory device may be or may include one or more other memory devices, such as but not limited to an FeRAM, a cross-point memory, a phase-change memory, a hysteresis memory, an SRAM, and/or another type of nonvolatile or volatile memory.

Referring to FIG. 1 to FIG. 5, a semiconductor memory device according to some example embodiments may include a cell area 20, a cell area separation film 22, and a peripheral area 24, each of which may be non-overlapping with one another.

The cell area separation film 22 may be formed along an outer edge of the cell area 20. The cell area separation film 22 may separate the cell area 20 and the peripheral area 24 from each other. The peripheral area 24 may be defined as a periphery around the cell area 20.

The cell area 20 may include a plurality of cell active areas ACT. The cell active area ACT may be defined by a cell element separation film (105 in FIG. 5 to FIG. 9) formed in a substrate (100 in FIG. 4). As the design rule of the semiconductor memory device decreases, the cell active area ACT may have a bar shape extending in a diagonal line and/or an oblique line as shown in FIG. 2. For example, the cell active area ACT may extend in a third direction D3. The third direction D3 may intersect a first direction D1 at an angle that is less than ninety degrees, for example at an angle of seventy degrees; however, example embodiments are not limited thereto.

Each of a plurality of gate electrodes may extend in the first direction D1 and across the cell active area ACT. The plurality of gate electrodes may extend parallel to each other. Each of the plurality of gate electrodes may be for example, each of a plurality of word-lines WL. The word-lines WL may be spaced from each other by an equal spacing, e.g. at a constant pitch. A width of the word-line WL and/or a spacing between word-lines WL may be determined according to the design rule.

The word-line WL may extend to the cell area separation film 22. A portion of the word-line WL may overlap the cell area separation film 22 in a fourth direction D4. The fourth direction D4 may be perpendicular to a surface of the substrate 100.

The two word-lines WLs extending in the first direction D1 may allow each cell active area ACT or each island of active area ACT to be divided into three portions. The cell active area ACT may include storage connection areas 103b and a bit-line connection area 103a. The bit-line connection area 103a may be located at a middle portion of the cell active area ACT, while the storage connection areas 103b may be located at ends of the cell active area ACT.

A plurality of bit-lines BL extending in a second direction D2 perpendicular to the extension direction of the word-line WL may be disposed on the word-lines WL. The plurality of bit-line BL may extend parallel to each other. The bit-lines BL may be arranged to be spaced from each other by a same spacing, e.g. at a constant pitch that may be the same as, less than, or greater than a pitch separating adjacent word-lines WL. A width of the bit-line BL and/or a spacing between bit-lines BLs may be determined according to the design rule.

The bit-line BL may extend to the cell area separation film 22. A portion of the bit-line BL may overlap the cell area separation film 22 in the fourth direction D4. The fourth direction D4 may be orthogonal to the first direction D1, the second direction D2, and the third direction D3. The fourth direction D4 may be a thickness direction of the substrate 100.

The plurality of bit-lines BL may include a normal bit-line group BL_NG and a dummy bit-line group BL_DG. The dummy bit-line group BL_DG may be disposed at a boundary of the cell area 20. The dummy bit-line group BL_DG may be disposed at the boundary of the cell area 20 extending in the second direction D2. Because the dummy bit-line groups BL_DG are respectively disposed at the boundaries of the cell area 20 extending in the second direction D2, the normal bit-line group BL_NG may be disposed between the dummy bit-line groups BL_DG. Bit-lines BL in the dummy bit-line group BL_DG may not be active, e.g. may not be electrically active, during operation of the semiconductor device.

The normal bit-line group BL_NG may include a plurality of normal bit-lines BL_N extending in the second direction D2. The normal bit-lines BL_N may be spaced apart from each other in the first direction D1. The normal bit-line BL_N may act as a bit-line used for operation of a memory cell included in the semiconductor memory device.

The dummy bit-line group BL_DG may include a plurality of dummy bit-lines BL_DA and BL_DB extending in the second direction D2. Each of the plurality of dummy bit-lines BL_DA and BL_DB may act as a bit-line that is not used for operation of the memory cell included in the semiconductor memory device. For example, because a voltage source and/or a current source is not connected to the plurality of dummy bit-lines BL_DA and BL_DB, each of the plurality of dummy bit-lines BL_DA and BL_DB may be in an electrically floating state.

The dummy bit-line group BL_DG may include an outermost dummy bit-line BL_DA that is closest to the peripheral area 24 in the first direction D1. The dummy bit-line group BL_DG may include an inner dummy bit-line BL_DB disposed between the outermost dummy bit-line BL_DA and the normal bit-line BL_N.

The outermost dummy bit-line BL_DA may extend in the second direction D2 and in parallel with the inner dummy bit-line BL_DB. The outermost dummy bit-line BL_DA is spaced apart from the inner dummy bit-line BL_DB in the first direction D1. Although at least a portion of the outermost dummy bit-line BL_DA may overlap with the cell area separation film 22 in the first direction D1, example embodiments are not limited thereto.

The dummy bit-line group BL_DG may include, for example, at least one inner dummy bit-line BL_DB. In the semiconductor memory device according to some example embodiments, the dummy bit-line group BL_DG may include the outermost dummy bit-line BL_DA and two inner dummy bit-lines BL_DB.

A boundary peripheral gate PR_ST may extend in the second direction D2 and in parallel with the outermost dummy bit-line BL_DA. The boundary peripheral gate PR_ST may be disposed at a boundary between the cell area separation film 22 and the peripheral area 24. Unlike the drawings, in the semiconductor memory device according to some example embodiments, the boundary peripheral gate PR_ST may extend in the first direction D1. Further, the semiconductor memory device according to some example embodiments may not include the boundary peripheral gate PR_ST.

A semiconductor memory device according to some example embodiments may include various contact arrangements formed on the cell active area ACT. The various contact arrangements may include, for example, a digit-line contact or a direct contact DC, a buried contact BC, and a landing pad LP, etc.

In this connection, the direct contact DC may refer to a contact that electrically connects the cell active area ACT to the bit-line BL. The buried contact BC may refer to a contact connecting the cell active area ACT to a lower electrode (191 in FIG. 6 and FIG. 9) of a capacitor. In terms of an arrangement structure, a contact area between the buried contact BC and the cell active area ACT may be small. Accordingly, a conductive landing pad LP may be introduced to expand the contact area between the cell active area ACT and the buried contact BC, and to expand the contact area between the buried contact BC and the lower electrode (191 in FIG. 6 and FIG. 9) of the storage element or the capacitor.

The landing pad LP may be disposed between the cell active area ACT and the buried contact BC and may be disposed between the buried contact BC and the lower electrode (191 in FIG. 6 and FIG. 9) of the capacitor. In the semiconductor memory device according to some example embodiments, the landing pad LP may be disposed between the buried contact BC and the lower electrode of the capacitor. Expanding the contact area via the introduction of the landing pad LP may allow a contact resistance between the cell active area ACT and the lower electrode of the capacitor to be reduced.

The direct contact DC may be connected to the bit-line connection area 103a. The buried contact BC may be connected to the storage connection area 103b. As the buried contact BC is dispose in each of both opposing ends of the cell active area ACT, the landing pad LP may be disposed adjacent to each of both opposing ends of the cell active area ACT and partially overlap with the buried contact BC. For example, the buried contact BC may be formed to overlap the cell active area ACT and the cell element separation film (105 in FIG. 5) between adjacent word-lines WL and between adjacent bit-lines BL.

The word-line WL may be formed as a structure buried in the substrate 100. The word-line WL may extend across the cell active area ACT between the direct contacts DC or between the buried contacts BC. As shown, two word-lines WL may extend through one cell active area ACT. As the cell active area ACT extends along the third direction D3, the extension direction of the word-line WL may have an angle smaller than 90 degrees with respective to the extension direction of the cell active area ACT.

The direct contacts DC and the buried contacts BC may be arranged in a symmetrical manner Accordingly, the direct contacts DC and the buried contacts BC may be arranged in a straight line or colinearly along the first direction D1 and the second direction D2. Unlike the direct contact DC and the buried contact BC, the landing pads LP may be arranged in a zigzag manner in the second direction D2 which the bit-line BL extends. Further, the landing pads LP may overlap with the same portion of a side face of each bit-line BL in the first direction D1 in which the word-line WL extends. For example, each of landing pads LP in a first line may overlap the left side face of a corresponding bit-line BL, while each of the landing pads LP in a second line may overlap with a right side face of the corresponding bit-line BL.

Referring to FIG. 1 to FIG. 9, the semiconductor memory device according to some example embodiments may include a plurality of cell gate structures 110, a plurality of cell conductive lines 140N, 140DA, and 140DB, a plurality of storage pads 160, an information storage element 190, and a peripheral gate conductive film 240.

The substrate 100 may include the cell area 20, the cell area separation film 22, and the peripheral area 24. The substrate 100 may be or may include a silicon substrate or an SOI (silicon-on-insulator). Alternatively or additionally, the substrate 100 may be or may include one or more of silicon germanium, SGOI (silicon germanium on insulator), indium antimonide, lead tellurium compound, indium arsenic, indium phosphide, gallium arsenide or gallium antimonide. However, example embodiments are not limited thereto. The substrate 100 may be undoped or may be doped, e.g. may be doped with an impurity such as boron; however, example embodiments are not limited thereto.

The plurality of cell gate structures 110, the plurality of cell conductive lines 140N, 140DA, and 140DB, the plurality of storage pads 160, and the information storage element 190 may be disposed in the cell area 20. The peripheral gate structure 240 may be disposed in the peripheral area 24.

A cell element separation film 105 may be formed in the substrate 100 and in the cell area 20. The cell element separation film 105 may have shallow trench isolation (STI) structure with excellent element separation ability. The cell element separation film 105 may define the cell active area ACT within the cell area 20. The cell active area ACT defined by the cell element separation film 105 may have an elongate island shape including a minor axis and a major axis as shown in FIG. 2 to FIG. 5. The cell active area ACT may have a diagonally extension shape to have an angle of smaller than 90 degrees with respect to the extension direction of the word-line WL horizontally flush with the cell element separation film 105. Further, the cell active area ACT may have a diagonally extension shape to have an angle of less than 90 degrees with respect to an extension direction of the bit-line BL formed on the cell element separation film 105.

The cell area separation film 22 may have an STI structure. The cell area 20 may be defined by the cell area separation film 22.

Each of the cell element separation film 105 and the cell area separation film 22 may include, for example, at least one of a silicon oxide film, a silicon nitride film, and a silicon oxynitride film. However, example embodiments are not limited thereto. In FIG. 6 to FIG. 9, each of the cell element separation film 105 and the cell area separation film 22 is shown to be formed as a single insulating film. However, this is only for convenience of illustration. However, example embodiments are not limited thereto. Depending on a width of each of the cell element separation film 105 and/or the cell area separation film 22, each of the cell element separation film 105 and the cell area separation film 22 may be formed as a single insulating film, or as a stack of a plurality of insulating films.

In FIG. 6 and FIG. 8, an upper surface of the cell element separation film 105, an upper surface of the substrate 100, and an upper surface of the cell area separation film 22 are shown to be horizontally flush with each other. However, this is only for convenience of illustration, and example embodiments are not limited thereto.

The cell gate structure 110 may be formed in the substrate 100 and the cell element separation film 105. The cell gate structure 110 may be formed along the cell element separation film 105 and the cell active area ACT defined by the cell element separation film 105.

The cell gate structure 110 may include a cell gate trench 115 formed in the substrate 100 and the cell element separation film 105, a cell gate insulating film 111, a cell gate electrode 112, a cell gate capping pattern 113, and a cell gate capping conductive film 114. In this connection, the cell gate electrode 112 may correspond to the row or word-line WL. Unlike a configuration as shown, the cell gate structure 110 may not include the cell gate capping conductive film 114.

The cell gate insulating film 111 may extend along a side wall and a bottom surface of the cell gate trench 115. The cell gate insulating film 111 may extend along a profile of at least a portion of the cell gate trench 115. The cell gate insulating film 111 may include, for example, at least one of silicon oxide, silicon nitride, silicon oxynitride, or high dielectric constant materials having a higher dielectric constant than that of silicon oxide. The high dielectric constant material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The cell gate electrode 112 may be formed on the cell gate insulating film 111. The cell gate electrode 112 may fill a portion of the cell gate trench 115. The cell gate capping conductive film 114 may extend along an upper surface of the cell gate electrode 112.

The cell gate electrode 112 may include at least one of metal, metal alloy, conductive metal carbonitride, conductive metal carbide, metal silicide, doped semiconductor material, conductive metal oxynitride, and conductive metal oxide. The cell gate electrode 112 may include at least one of for example, TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni-Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and combinations thereof. However, example embodiments are not limited thereto. The cell gate capping conductive film 114 may include, for example, polysilicon and/or polysilicon germanium, and may be doped or undoped. However, example embodiments are not limited thereto.

The cell gate capping pattern 113 may be disposed on the cell gate electrode 112 and the cell gate capping conductive film 114. The cell gate capping pattern 113 may fill a remaining portion of the cell gate trench 115 except for the cell gate electrode 112 and the cell gate capping conductive film 114. The cell gate insulating film 111 is shown to extend along a side wall of the cell gate capping pattern 113. However, example embodiments are not limited thereto. The cell gate capping pattern 113 may include, for example, at least one of silicon nitride SiN, silicon oxynitride SiON, silicon oxide SiO$_2$, silicon carbonitride SiCN, silicon oxycarbonitride SiOCN, and combinations thereof.

Although not shown, an impurity doped area may be formed on at least one side of the cell gate structure 110. The impurity doped area may act as a source/drain area and/or a lightly-doped drain area and/or a pocket area of the transistor. The impurity doped area may be formed in the storage connection area 103*b* and the bit-line connection area 103*a* of FIG. 3.

The bit-line structure may include cell conductive lines 140N, 140DA, and 140DB and a cell line capping film 144. The cell conductive lines 140N, 140DA, and 140DB may be formed on the substrate 100 including the cell gate structure 110, and on the cell element separation film 105 formed in the substrate 100. The cell conductive lines 140N, 140DA, and 140DB may intersect a cell element separation film 105, and the cell active area ACT defined by the cell element separation film 105. The cell conductive lines 140N, 140DA, and 140DB may be formed to intersect with the cell gate structure 110. In this connection, the cell conductive lines 140N, 140DA, and 140DB may correspond to the bit-lines BL.

The cell conductive lines 140N, 140DA, and 140DB may include a normal cell conductive line 140N and dummy cell conductive lines 140DA and 140DB. The dummy cell conductive lines 140DA and 140DB may include an outermost dummy cell conductive line 140DA and an inner dummy cell conductive line 140DB. The normal cell conductive line 140N may correspond to the normal bit-line BL_N. The outermost dummy cell conductive line 140DA may correspond to the outermost dummy bit-line BL_DA. The inner dummy cell conductive line 140DB may correspond to the inner dummy bit-line BL_DB.

Each of or any of the cell conductive lines 140N, 140DA, and 140DB may include a stack of multiple films. Each of the cell conductive lines 140N, 140DA, and 140DB may include, for example, a first cell conductive film 141, a second cell conductive film 142, and a third cell conductive film 143. The first to third cell conductive films 141, 142, and 143 may be sequentially stacked on the substrate 100 and the cell element separation film 105. Although each of the cell conductive lines 140N, 140DA, and 140DB is shown to be composed of the three films, example embodiments are not limited thereto.

Each of or any of the first to third cell conductive films 141, 142, and 143 may independently or collectively include, for example, at least one of a semiconductor material doped with impurities, a conductive silicide compound, a conductive metal nitride metal, and a metal alloy. For example, the first cell conductive film 141 may include a doped semiconductor material. The first cell conductive film 141 may be a semiconductor conductive line. The second cell conductive film 142 may include at least one of the conductive silicide compound and the conductive metal nitride. The third cell conductive film 143 may include at least one of metal and metal alloy. However, example embodiments are not limited thereto. Each of or either of the second and third cell conductive films 142 and 143 may be a metallic conductive line.

The outermost dummy cell conductive line 140DA may have a first width W1 in the first direction D1. The inner dummy cell conductive line 140DB closest to the outermost dummy cell conductive line 140DA may have a second width W2 in the first direction D1. The normal cell conductive line 140N may have a third width W3 in the first direction D1.

In this connection, each of the width W1 of the outermost dummy cell conductive line 140DA, the width W2 of the inner dummy cell conductive line 140DB, and the width W3 of the normal cell conductive line 140N may be a width of a bottom surface of each of the cell conductive lines 140N, 140DA, and 140DB. For example, the width W1 of the outermost dummy cell conductive line 140DA, the width W2 of the inner dummy cell conductive line 140DB, and the width W3 of the normal cell conductive line 140N may be a width of a bottom surface of the first cell conductive film 141 facing toward the substrate 100.

For example, the width W2 of the inner dummy cell conductive line 140DB is the same as the width W3 of the normal cell conductive line 140N. In the semiconductor memory device according to some example embodiments, the width W1 of the outermost dummy cell conductive line 140DA is greater than the width W2 of the inner dummy cell conductive line 140DB.

A bit-line contact 146 may be formed between the cell conductive lines 140N, 140DA, and 140DB and the substrate 100. For example, the cell conductive lines 140N, 140DA, and 140DB may be formed on the bit-line contact 146. For example, the bit-line contact 146 may be formed at a point where each of the cell conductive lines 140N, 140DA, and 140DB intersects a center portion of the cell active area ACT having an elongate island shape. The bit-line contact 146 may be formed between the bit-line connection area 103*a* of the cell active area ACT and the cell conductive lines 140N, 140DA, and 140DB. The bit-line contact 146 may be connected to the bit-line connection area 103*a*.

The plurality of bit-line contacts 146 may extend along the second direction D2. Each of the cell conductive lines 140N, 140DA, and 140DB may be disposed on the plurality of bit-line contacts 146 and extend along the second direction D2.

The bit-line contact 146 may electrically connect the cell conductive lines 140N, 140DA, and 140DB to the substrate 100. In this connection, the bit-line contact 146 may correspond to the direct contact DC. The bit-line contact 146 may include, for example, at least one of a semiconductor material doped with impurities such as boron and/or phosphorus and/or arsenic, a conductive silicide compound, a conductive metal nitride, and a metal. In the semiconductor memory device according to some example embodiments, the bit-line contact 146 may include a semiconductor material doped with impurities.

In FIG. 8 in which the normal cell conductive line 140N is shown, in an area overlapping an upper surface 146US of the bit-line contact, the normal cell conductive line 140N may include the second cell conductive film 142 and the third cell conductive film 143. In an area that does not overlap with the upper surface 146US of the bit-line contact, the normal cell conductive line 140N may include the first to third cell conductive films 141, 142, and 143.

Although not shown, the dummy cell conductive line 140DA and 140DB may have the same structure as that of the normal cell conductive line 140N.

The second cell conductive film 142 may extend along an upper surface 141US of the first cell conductive film and an upper surface 146US of the bit-line contact. A bottom surface 142BS of the second cell conductive film may face toward the upper surface 141US of the first cell conductive film and the upper surface 146US of the bit-line contact.

The bottom surface 142BS of the second cell conductive film may directly contact the upper surface 141US of the first cell conductive film and the upper surface 146US of the bit-line contact. Based on an upper surface of the substrate 100, a height of the bottom surface 142BS of the second cell conductive film may be the same as a height of the upper surface 146US of the bit-line contact. For example, based on an upper surface of the substrate 100, a height of the upper surface 141US of the first cell conductive film may be the same as the height of the upper surface 146US of the bit-line contact.

The plurality of bit-line contacts 146 may include a first bit-line contact, a second bit-line contact and a third bit-line contact under one cell conductive line 140N, 140DA, or 140DB. The first to third bit-line contacts may be sequentially arranged from the cell area separation film 22 in the second direction D2. The second bit-line contact may be disposed between the first bit-line contact and the third bit-line contact. In the semiconductor memory device according to some example embodiments, the bottom surface 142BS of the second cell conductive film may directly contact an upper surface 146US of the first bit-line contact, an upper surface 146US of the second bit-line contact, and a upper surface 146US of the third bit-line contact.

In FIG. 8, it is illustrated that the bit-line contact 146 is not disposed between the substrate 100 and the normal cell conductive line 140N closest to the cell area separation film 22. Example embodiments are not limited thereto. Unlike the illustration, the bit-line contact 146 may be disposed between the substrate 100 and the normal cell conductive line 140N closest to the cell area separation film 22.

The cell line capping film 144 may be disposed on the cell conductive lines 140N, 140DA, and 140DB. The cell line capping film 144 may extend in the second direction D2 and along the upper surfaces of the cell conductive lines 140N, 140DA, and 140DB. In this case, the cell line capping film 144 may include, for example, at least one of a silicon nitride, a silicon oxynitride, a silicon carbonitride, and a silicon oxycarbonitride. In the semiconductor memory device according to some example embodiments, the cell line capping film 144 may include, for example, a silicon nitride film. Although the cell line capping film 144 is shown to be a single film, example embodiments are not limited thereto.

A cell insulating film 130 may be formed on the substrate 100 and the cell element separation film 105. For example, the cell insulating film 130 may be disposed on a portion of the substrate 100 and a portion of the cell element separation film 105 on which the bit-line contact 146 has not been formed. The cell insulating film 130 may be disposed between the substrate 100 and the cell conductive line 140 and between the cell element separation film 105 and the cell conductive lines 140N, 140DA, and 140DB.

The cell insulating film 130 may be a single film. However, as illustrated, the cell insulating film 130 may be a stack of multi-films including the first cell insulating film 131 and the second cell insulating film 132. For example, the first cell insulating film 131 may include a silicon oxide film, and the second cell insulating film 132 may include a silicon nitride film. Example embodiments are not limited thereto. Unlike the configuration as shown, the cell insulating film 130 may include three or more insulating films.

A cell buffer film 101 may be disposed between the cell insulating film 130 and the cell area separation film 22. Although cell buffer film 101 may include, for example, a silicon oxide film, example embodiments are not limited thereto.

A cell line spacer 150 may be disposed on sidewalls of the cell conductive lines 140N, 140DA, and 140DB, and the cell line capping film 144. In portions of the cell conductive lines 140N, 140DA, and 140DB where the bit-line contact 146 is formed, the cell line spacer 150 may be formed on the substrate 100 and the cell element separation film 105. The cell line spacer 150 may be disposed on sidewalls of the cell conductive lines 140N, 140DA, and 140DB, the cell line capping film 144 and the bit-line contact 146.

In remaining portions of the cell conductive lines 140N, 140DA, and 140DB where the bit-line contact 146 is not formed, the cell line spacer 150 may be disposed on the cell insulating film 130. The cell line spacer 150 may be disposed on the sidewalls of the cell conductive lines 140N, 140DA, and 140DB, and the cell line capping film 144.

The cell line spacer 150 may be a single layer. However, as illustrated, the cell line spacer 150 may be a stack of multi-films including the first to fourth cell line spacers 151, 152, 153, and 154. For example, each of or any of the first to fourth cell line spacers 151, 152, 153, and 154 may include one of a silicon oxide film, a silicon nitride film, a silicon oxynitride film (SiON), a silicon oxycarbonitride film (SiOCN), air, and combinations thereof. However, example embodiments are not limited thereto.

For example, the second cell line spacer 152 may not be disposed on the cell insulating film 130, but may be disposed on a sidewall of the bit-line contact 146. The cell line spacer 150 may be disposed on a long sidewall extending in the second direction D2 among sidewalls of the cell conductive lines 140N, 140DA, and 140DB.

A fence pattern 170 may be disposed on the substrate 100 and the cell element separation film 105. The fence pattern 170 may be formed to overlap the cell gate structure 110 formed in the substrate 100 and the cell element separation film 105. The fence pattern 170 may be disposed between the cell conductive lines 140N, 140DA, and 140DB extending in the second direction D2. The fence pattern 170 may include, for example, at least one of silicon oxide, silicon nitride, silicon oxynitride, and a combination thereof.

A plurality of storage contacts 120 may be disposed between the cell conductive lines 140N, 140DA, and 140DB adjacent to each other in the first direction D1. The storage contact 120 may be disposed between the fence patterns 170 adjacent to each other in the second direction D2. The storage contact 120 may overlap portions of the substrate 100 and the cell element separation film 105 between the adjacent cell conductive lines 140N, 140DA, and 140DB. The storage contact 120 may be connected to the storage connection area 103b of the cell active area ACT. In this connection, the storage contact 120 may correspond to the buried contact BC.

The plurality of storage contacts 120 may be arranged along, e.g. colinear along the first direction D1. For example, the plurality of storage contacts 120 may include a first storage contact, a second storage contact, and a third storage contact. The first storage contact, the second storage contact, and the third storage contact may be sequentially arranged from the cell area separation film 22 and in the first direction D1. The second storage contact may be disposed between the first storage contact and the third storage contact.

In the semiconductor memory device according to some example embodiments, each of the first storage contact and the third storage contact may include or define or surround or contain therein a first airgap AG_BC. The second storage contact does not include or define or surround or contain therein an airgap. Between the first storage contact including the first airgap AG_BC and the third storage contact including the first airgap AG_BC, the second storage contact not including an airgap may be disposed. The first airgap AG_BC may be under vacuum, and/or may include air such as but not limited to clean, dry air and/or air including a noble gas such as argon; however, example embodiments are not limited thereto. The first airgap AG_BC may be a void, or a seam, within the first through third storage contacts.

The storage contacts 120 including the first airgap AG_BC may be arranged in a discrete manner For example, the storage contacts 120 including the first airgap AG_BC may be arranged to be spaced from each other by a regular spacing. However, example embodiments are not limited thereto.

It is shown that two second storage contacts that do not include the first airgap AG_BC are disposed between the first storage contacts including the first airgap AG_BC and the third storage contacts including the first airgap AG_BC. However, this is only for convenience of the description. Example embodiments are not limited thereto.

The cell area 20 may include a central area and an edge area. The edge area of the cell area 20 may be defined around the central area of the cell area 20. The storage contact 120 located in the central area of the cell area 20 does not include the first airgap AG_BC. Some of the storage contacts 120 disposed in the edge area of the cell area 20 may include the first airgap AG_BC. Due to edge diffraction phenomenon as described in more detail below with reference to FIG. 33 and FIG. 34, the first airgap AG_BC included in the storage contact 120 may be formed.

The storage contact 120 may include, for example, at least one of a semiconductor material such as polysilicon doped with impurities such as at least one of phosphorus, arsenic, or boron, a conductive silicide compound, a conductive metal nitride, and a metal. In the semiconductor memory device according to some example embodiments, the storage contact 120 may include a semiconductor material doped with impurities.

The storage pad 160 may be disposed on each of the storage contacts 120. The storage pad 160 may be electrically connected to the storage contact 120. The storage pad 160 may be connected to the storage connection area 103b of the cell active area ACT. In this connection, the storage pad 160 may correspond to the landing pad LP.

The storage pad 160 may overlap a portion of an upper surface of each of the cell conductive lines 140N, 140DA, and 140DB. The storage pad 160 may include, for example, at least one of a semiconductor material doped with impurities, a conductive silicide compound, a conductive metal nitride, a conductive metal carbide, a metal, and a metal alloy.

A pad separation insulating film 180 may be formed on the storage pad 160 and the cell conductive lines 140N, 140DA, and 140DB. For example, the pad separation insulating film 180 may be disposed on the cell line capping film 144. The pad separation insulating film 180 may separate the storage pads 160 constituting or included in a plurality of isolated areas from each other. The pad separation insulating film 180 may not cover an upper surface 160US of the storage pad. The pad separation insulating film 180 may fill a pad separation recess. The pad separation recess may separate adjacent storage pads 160 from each other.

The pad separation insulating film 180 may include an insulating material, and may electrically separate the plurality of storage pads 160 from each other. For example, the pad separation insulating film 180 may include, for example, at least one of a silicon oxide film, a silicon nitride film, a silicon oxynitride film, a silicon oxycarbonitride film, and a silicon carbonitride film. Example embodiments are not limited thereto.

The peripheral gate structure may be disposed on the substrate 100 and in the peripheral area 24. The peripheral gate structure may be disposed on a peripheral active area defined by a peripheral element separation film. The peripheral gate structure may be formed in the peripheral area 24, and may be included in a peripheral circuit for controlling a memory cell formed in the cell area 20.

The peripheral gate structure may include a peripheral gate insulating film 230, a peripheral gate conductive film 240, and a peripheral capping film 244 sequentially stacked on the substrate 100. The peripheral gate structure may include a peripheral spacer 245 disposed on a sidewall of the peripheral gate conductive film 240 and a sidewall of the peripheral capping film 244.

The boundary peripheral gate PR_ST shown in FIG. 4 may include the peripheral gate conductive film 240. For example, the peripheral gate structure of the peripheral area 24 may include the peripheral gate insulating film 230, the peripheral gate conductive film 240, the peripheral capping film 244, and the peripheral spacer 245 as shown in FIG. 6.

The peripheral gate conductive film 240 may include first to third peripheral conductive films 241, 242, and 243 sequentially stacked on the peripheral gate insulating film 230. In one example, an additional conductive film may not be disposed between the peripheral gate conductive film 240 and the peripheral gate insulating film 230. In another example, unlike a configuration as shown, an additional conductive film such as a work function conductive film may be disposed between the peripheral gate conductive film 240 and the peripheral gate insulating film 230.

The peripheral gate conductive film 240 may have the same stack structure as that of each of the cell conductive lines 140N, 140DA, and 140DB, and may or may not be formed at the same time as each of the cell conductive lines 140N, 140DA, and 140DB. The first peripheral conductive film 241 may include the same material as that of the first cell conductive film 141. The second peripheral conductive film 242 may include the same material as that of the second cell conductive film 142. The third peripheral conductive film 243 may include the same material as that of the third cell conductive film 143.

The peripheral gate insulating film 230 may include, for example, silicon oxide, silicon nitride, silicon oxynitride, or a high dielectric constant material having a higher dielectric constant than that of silicon oxide. The peripheral spacer 245 may include, for example, at least one of silicon nitride, silicon oxynitride, silicon oxide, silicon carbonitride, silicon oxycarbonitride, and combinations thereof. The peripheral capping film 244 may include, for example, at least one of a silicon nitride film, a silicon oxynitride, and a silicon oxide.

A lower etch stop film 250 may be disposed on the substrate 100. The lower etch stop film 250 may be formed along a profile of the peripheral gate structure. The lower etch stop film 250 may be disposed on the sidewalls of the cell conductive lines 140N, 140DA, and 140DB extending in the first direction D1. The lower etch stop film 250 may extend along a long sidewall of the outermost dummy cell conductive line 140DA extending in the second direction D2. The lower etch stop film 250 may include, for example, at least one of a silicon nitride, a silicon oxynitride, a silicon carbonitride, and a silicon oxycarbonitride.

The lower peripheral interlayer insulating film 290 may be disposed on the lower etch stop film 250. The lower peripheral interlayer insulating film 290 may be disposed on the cell area separation film 22 and between the outermost dummy cell conductive line 140DA and the peripheral gate conductive film 240.

The lower peripheral interlayer insulating film 290 may include an oxide-based insulating material. An upper surface of the lower peripheral interlayer insulating film 290 may be coplanar with the lower etch stop film 250 extending along an upper surface of the peripheral capping film 244.

An upper peripheral interlayer insulating film 291 is disposed on the peripheral gate conductive film 240 and a lower peripheral interlayer insulating film 290. The upper peripheral interlayer insulating film 291 may cover the lower etch stop film 250 and the lower peripheral interlayer insulating film 290.

The upper peripheral interlayer insulating film 291 may include a material different from that of the lower peripheral interlayer insulating film 290. The upper peripheral interlayer insulating film 291 may include, for example, a nitride-based insulating material. For example, the upper peripheral interlayer insulating film 291 may include silicon nitride.

A peripheral wire line 265 may be disposed on the upper peripheral interlayer insulating film 291. The peripheral wire line 265 may connect a peripheral circuit formed in the peripheral area 24 and a memory cell formed in the cell area 20 to each other.

A bit-line contact plug 261 may extend through the upper peripheral interlayer insulating film 291 and the cell line capping film 144 and may be connected to the normal cell conductive line 140N. The bit-line contact plug 261 may be connected to a peripheral circuit formed in the peripheral area 24.

In some example embodiments, the bit-line contact plug 261 may not be connected to the dummy cell conductive lines 140DA and 140DB. For example, the bit-line contact plug 261 connected to the dummy cell conductive lines 140DA and 140DB may not be formed on the dummy cell conductive lines 140DA and 140DB. In another example, the bit-line contact plug 261 may be connected to the dummy cell conductive lines 140DA and 140DB. However, the bit-line contact plug 261 connected to the dummy cell conductive lines 140DA and 140DB may not be connected to the peripheral circuit formed in the peripheral area 24. Alternatively, the bit-line contact plug 261 connected to the dummy cell conductive lines 140DA and 140DB may not be connected to either or both of a voltage source or a current source.

The peripheral wire line 265 and the bit-line contact plug 261 may include the same material as that of the storage pad 160. The peripheral wire line 265 and the bit-line contact plug 261 may be formed at the same level at which the storage pad 160 is formed. An upper surface 265US of the peripheral wire line and an upper surface of the bit-line contact plug 261 may be coplanar with the upper surface 160US of the storage pad.

An upper etch stop film 295 may be disposed on the storage pad 160, the pad separation insulating film 180, the peripheral wire line 265, and the bit-line contact plug 261. The upper etch stop film 195 may extend not only to the cell area 20 but also to the peripheral area 24. The upper etch stop film 195 may include at least one of a silicon nitride film, a silicon carbonitride film, a silicon boron nitride film (SiBN), a silicon oxynitride film, and a silicon oxycarbide film.

The information storage element 190 may be disposed on the storage pad 160. The information storage element 190 may be electrically connected to the storage pad 160. A portion of the information storage 190 element may be disposed in the upper etch stop film 295. Although the information storage element 190 may include, for example, a capacitor, example embodiments are not limited thereto. The information storage element 190 includes a lower electrode 191 and a capacitor dielectric film 192, and an upper electrode 193. For example, the upper electrode 193 may be a plate upper electrode having a plate shape.

The lower electrode 191 may be disposed on the storage pad 160. Although the lower electrode 191 is shown to have a pillar shape, example embodiments are not limited thereto. In another example, the lower electrode 191 may have a cylindrical shape. The capacitor dielectric film 192 is formed on the lower electrode 191. The capacitor dielectric film 192 may be formed along a profile of the lower electrode 191. The upper electrode 193 is formed on the capacitor dielectric film 192. The upper electrode 193 may surround an outer sidewall of the lower electrode 191.

In one example, the capacitor dielectric film 192 may be disposed at a portion overlapping the upper electrode 193 in the fourth direction D4. In another example, unlike a configuration as illustrated, the capacitor dielectric film 192 may include a first portion overlapping the upper electrode 193 in the fourth direction D4, and a second portion not overlapping the upper electrode 193 in the fourth direction D4. That is, the second portion of the capacitor dielectric film 192 is not covered with the upper electrode 193.

Each of the lower electrode 191 and the upper electrode 193 may include, for example, a doped semiconductor material, a conductive metal nitride (such as titanium nitride, tantalum nitride, niobium nitride, or tungsten nitride), a metal (such as ruthenium, iridium, or titanium. or tantalum, etc.), and a conductive metal oxide (such as iridium oxide or niobium oxide, etc.). Example embodiments are not limited thereto.

Although the capacitor dielectric film 192 may include, for example, one of silicon oxide, silicon nitride, silicon oxynitride and high dielectric constant material and combinations thereof. Example embodiments are not limited thereto. In the semiconductor memory device according to some example embodiments, the capacitor dielectric film 192 may include a stack structure in which layers made of zirconium oxide, aluminum oxide, and zirconium oxide are sequentially stacked. In the semiconductor memory device according to some example embodiments, the capacitor dielectric film 192 may include a dielectric film including hafnium (Hf). In the semiconductor memory device according to some example embodiments, the capacitor dielectric film 192 may have a stack structure of a ferroelectric material film and a paraelectric material film.

An interlayer insulating film 292 may be disposed on the upper etch stop film 295. The interlayer insulating film 292 may cover a sidewall of the upper electrode 193. The interlayer insulating film 292 may include an insulating material.

Figure 10:
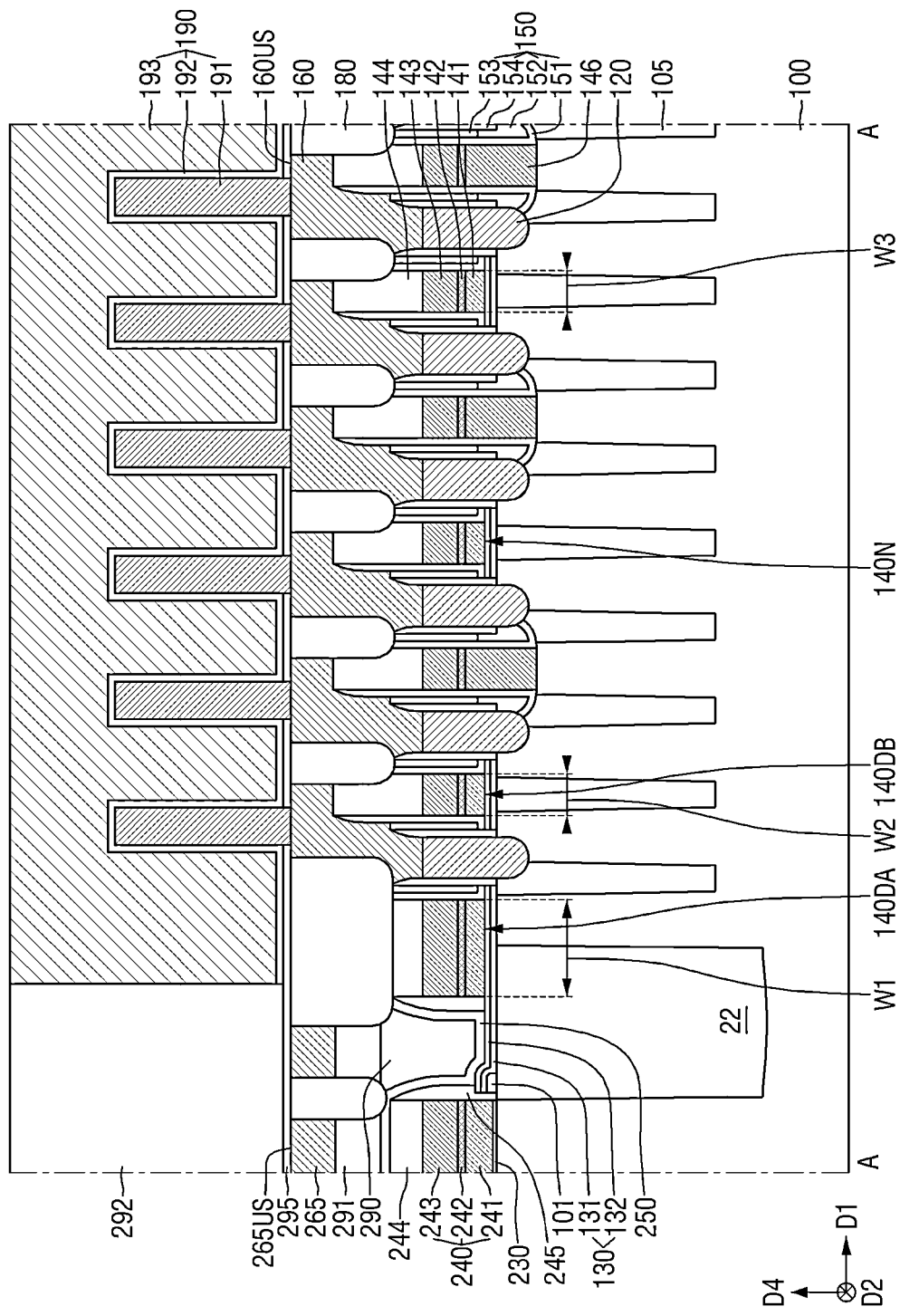
FIG. 10 and FIG. 11 are diagrams for illustrating a semiconductor memory device according to some example embodiments.
Figure 11:
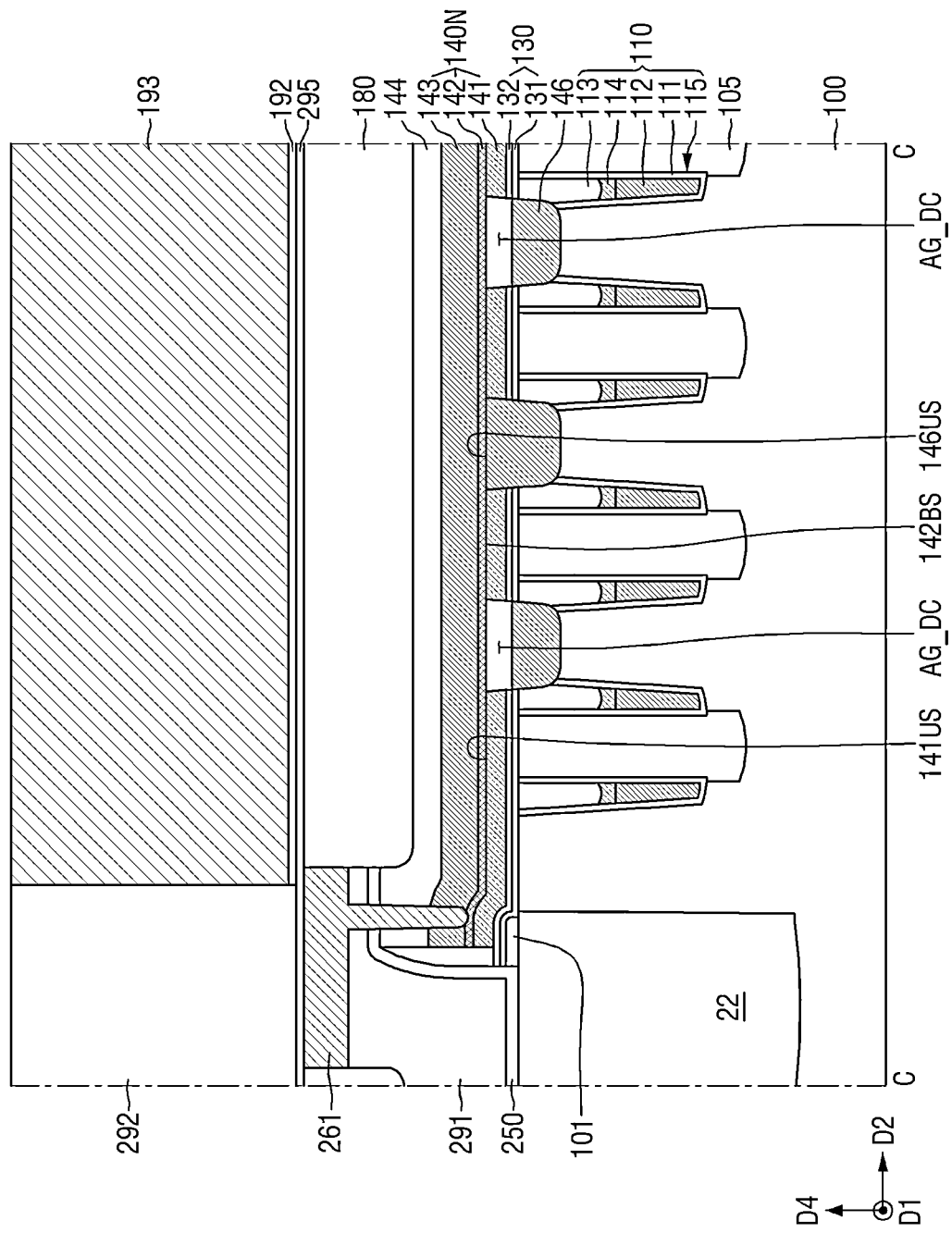

FIG. 10 and FIG. 11 are diagrams for illustrating a semiconductor memory device according to some example embodiments. For convenience of description, the description is based on differences thereof from those as described using FIG. 1 to FIG. 9.

For reference, FIG. 10 is a cross-sectional view taken along A-A of FIG. 4, and FIG. 11 is a cross-sectional view taken along C-C of FIG. 5.

Referring to FIGS. 10 and 11, the semiconductor memory device according to some example embodiments may further include a second airgap AG_DC disposed between each of the cell conductive lines 140N, 140DA, and 140DB and the bit-line contact 146.

One of the cell conductive lines 140N, 140DA, and 140DB may be disposed on the plurality of bit-line contacts 146 arranged in the first direction D1. The plurality of bit-line contacts 146 may include the first bit-line contact, the second bit-line contact and the third bit-line contact under one of the cell conductive lines 140N, 140DA, and 140DB.

The first to third bit-line contacts may be sequentially arranged from the cell area separation film 22 in the second direction D2.

In FIG. 11 in which the normal cell conductive line 140N is shown, the second airgap AG_DC may be disposed between the first bit-line contact and the normal cell conductive line 140N, and between the third bit-line contact and the normal cell conductive line 140N. The second airgap AG_DC is not disposed between the second bit-line contact and the normal cell conductive line 140N.

The second airgaps AG_DC may be arranged in a discrete manner between one normal cell conductive line 140N and the plurality of bit-line contacts 146. Although it is illustrated that one second bit-line contact is disposed between the second airgaps AG_DCs, this is only for convenience of description. The disclosure is not limited thereto.

Based on the upper surface of the substrate 100, each of a height of an upper surface 146US of the first bit-line contact in which the second airgap AG_DC is disposed and a height of an upper surface 146US of the third bit-line contact in which the second airgap AG_DC is disposed may be lower than that of an upper surface 146US of the second bit-line contact in which the second airgap AG_DC is not disposed. Based on the upper surface of the substrate 100, each of the height of the upper surface 146US of the first bit-line contact in which the second airgap AG_DC is disposed and the height of the upper surface 146US of the third bit-line contact in which the second airgap AG_DC is disposed may be smaller than a height of a bottom surface 142BS of the second cell conductive film. Based on the upper surface of the substrate 100, each of the height of the upper surface 146US of the first bit-line contact in which the second airgap AG_DC is disposed and the height of the upper surface 146US of the third bit-line contact in which the second airgap AG_DC is disposed may be lower than a height of the upper surface 141US of the first cell conductive film.

In one example, the upper surface 146US of the first bit-line contact in which the second airgap AG_DC is disposed and the upper surface 146US of the third bit-line contact in which the second airgap AG_DC is disposed may not contact the bottom surface 142BS of the second cell conductive film. Unlike a configuration shown, in another example, a portion of the upper surface 146US of the first bit-line contact in which the second airgap AG_DC is disposed, and a portion of the upper surface 146US of the third bit-line contact in which the second airgap AG_DC is disposed may contact the bottom surface 142BS of the second cell conductive film.

In one example, the plurality of storage contacts 120 arranged along the first direction D1 may not include the first airgap AG_BC.

In FIG. 10, the second airgap AG_DC is shown as invisible. However, it is only for convenience of description. The disclosure is not limited thereto.

Figure 12:
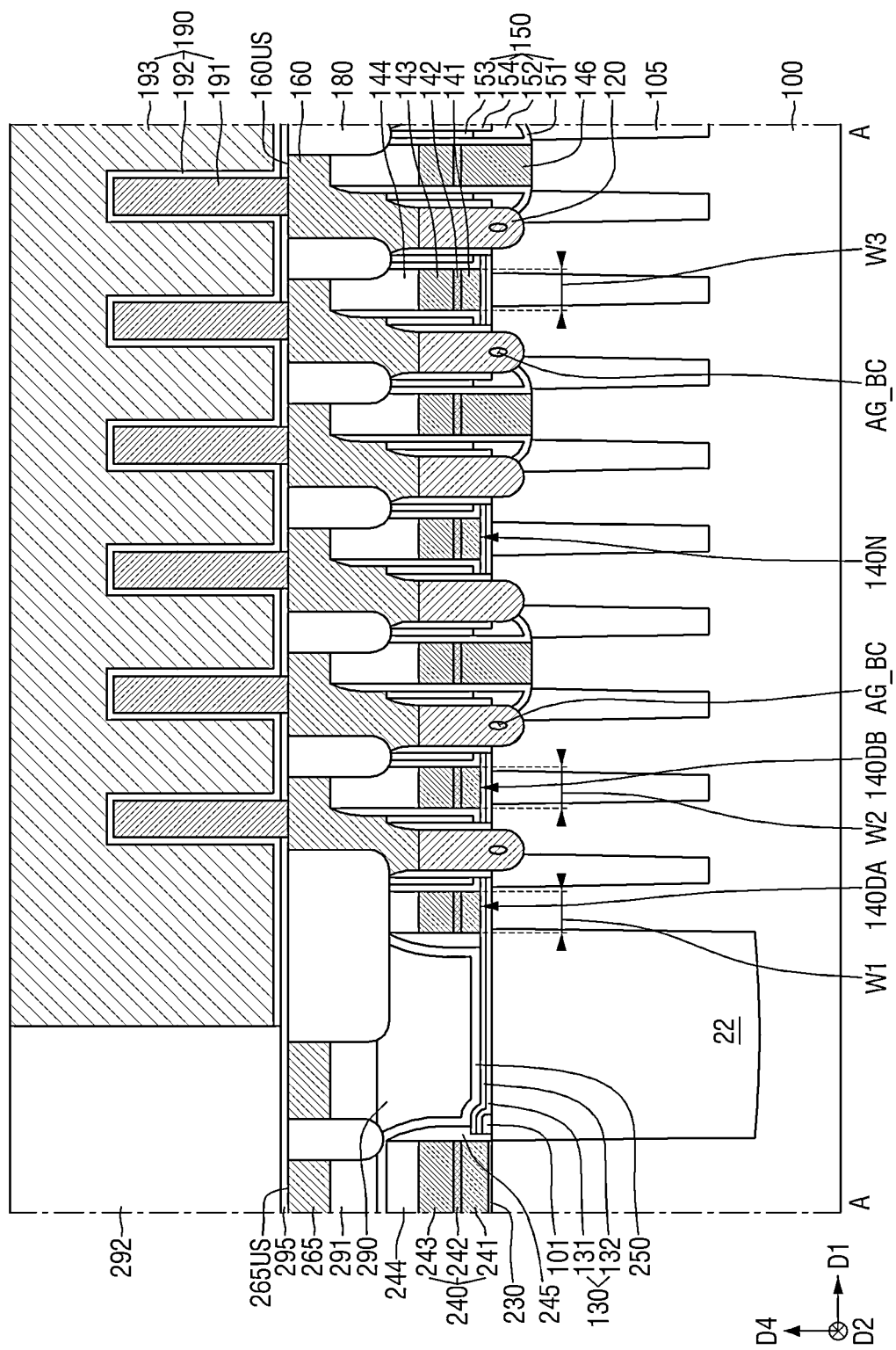
FIG. 12 is a diagram for illustrating a semiconductor memory device according to some example embodiments.

FIG. 12 is a diagram for illustrating a semiconductor memory device according to some example embodiments. For convenience of description, the description is based on differences thereof from those as described using FIG. 1 to FIG. 9.

Referring to FIG. 12, in the semiconductor memory device according to some example embodiments, a width W1 of the outermost dummy cell conductive line 140DA may be the same as a width W2 of the inner dummy cell conductive line 140DB.

The width W1 of the outermost dummy cell conductive line 140DA may be the same as a width W3 of the normal cell conductive line 140N.

Figure 13:
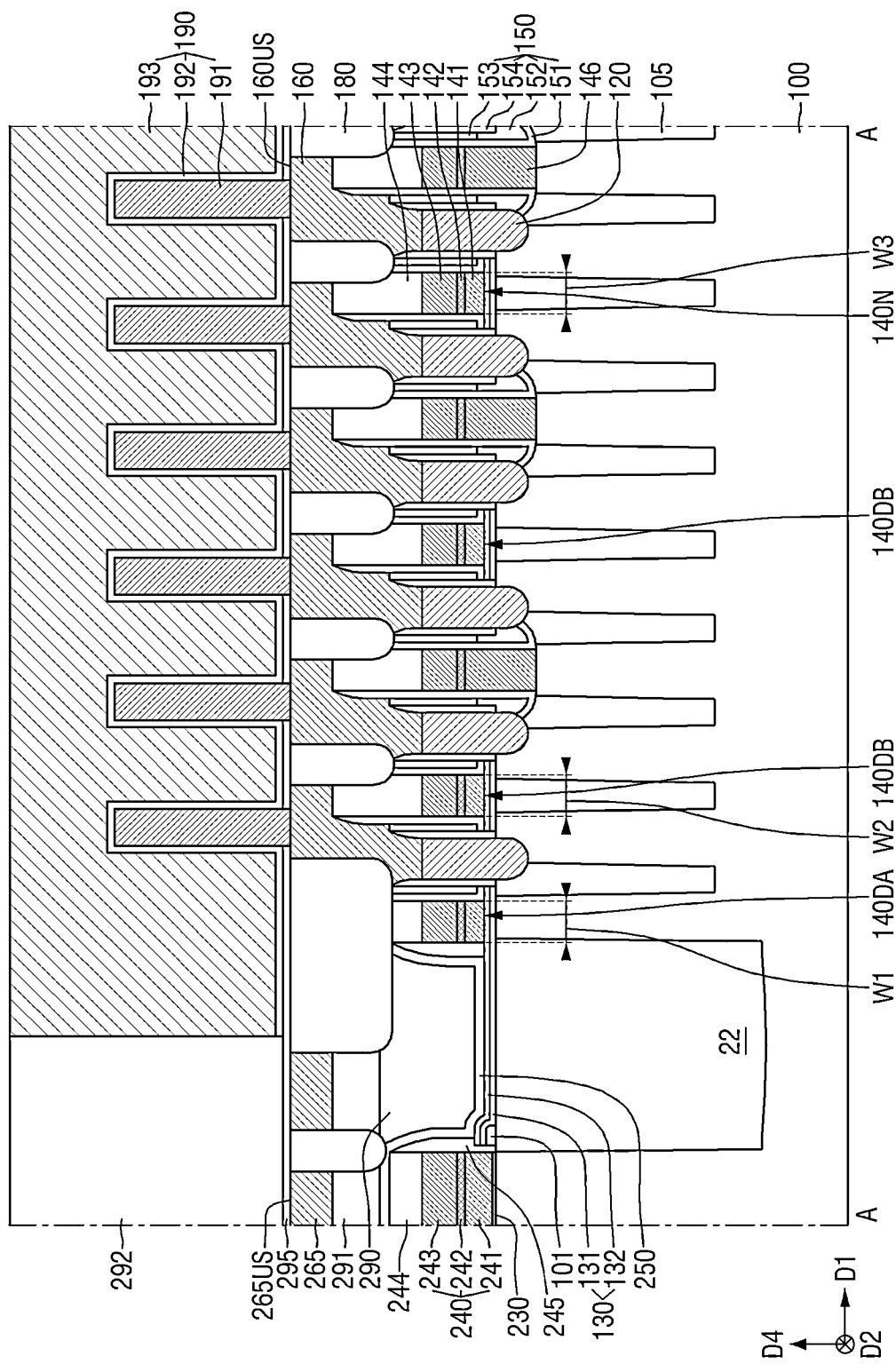
FIG. 13 is a diagram for illustrating a semiconductor memory device according to some example embodiments.
Figure 14:
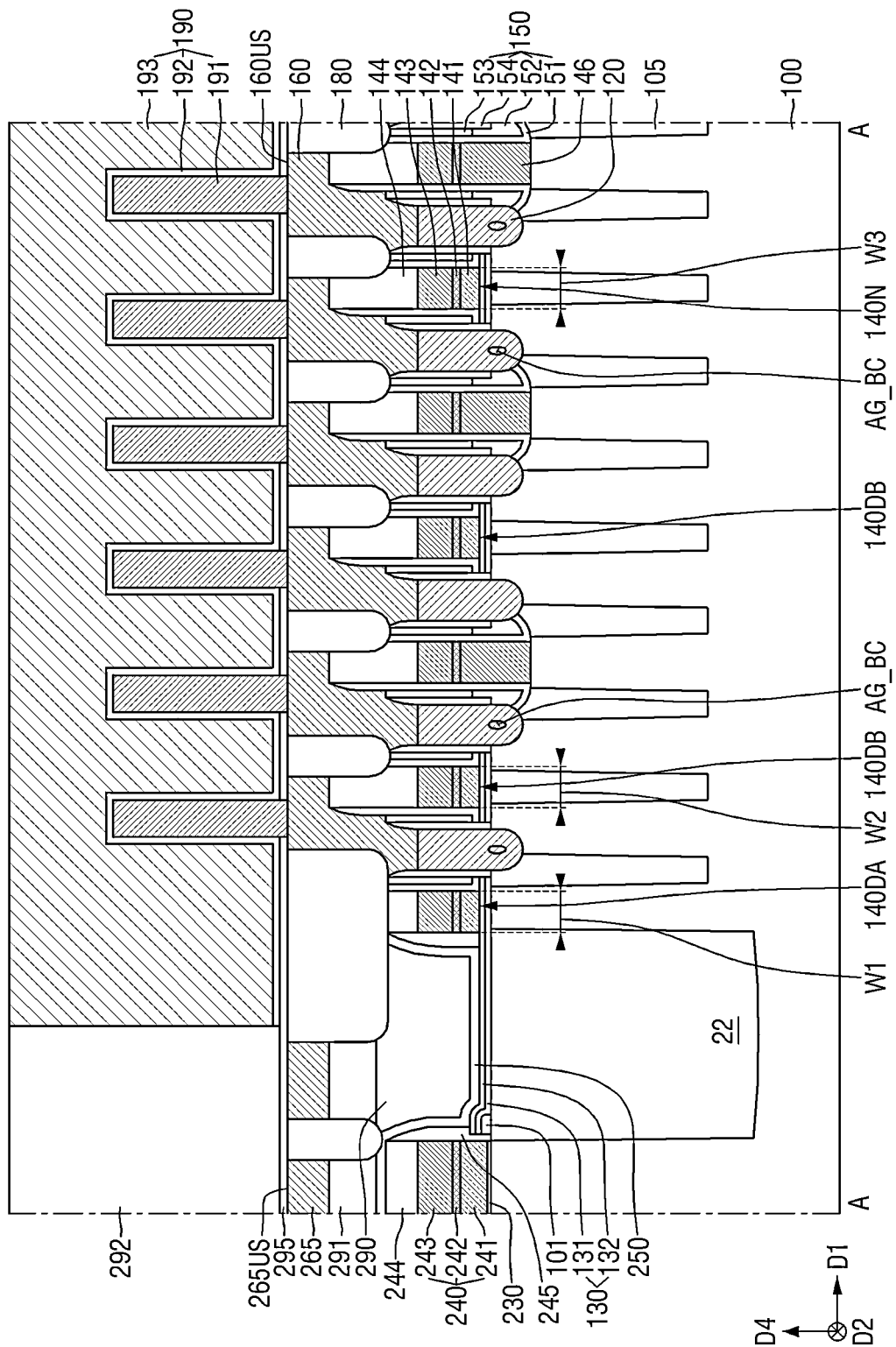
FIG. 14 is a diagram for illustrating a semiconductor memory device according to some example embodiments.

FIG. 13 is a diagram for illustrating a semiconductor memory device according to various example embodiments. FIG. 14 is a diagram for illustrating a semiconductor memory device according to some example embodiments. For convenience of description, the description is based on differences thereof from those as described using FIG. 1 to FIG. 9.

Referring to FIG. 13 and FIG. 14, the semiconductor memory device according to some example embodiments may include four or more dummy cell conductive lines 140DA and 140DB.

The dummy cell conductive lines 140DA and 140DB may include an outermost dummy cell conductive line 140DA and three or more inner dummy cell conductive lines 140DB.

For example, in FIG. 4, the dummy bit-line group BL_DG may include the outermost dummy bit-line BL_DA and the three or more inner dummy bit-line BL_DBs.

A width W2 of the inner dummy cell conductive line 140DB closest to the outermost dummy cell conductive line 140DA is the same as a width W3 of the normal cell conductive line 140N. In some example embodiments, a width W1 of the outermost dummy cell conductive line 140DA is greater than the width W2 of the inner dummy cell conductive line 140DB. In some example embodiments, the width W1 of the outermost dummy cell conductive line 140DA may be the same as the width W2 of the inner dummy cell conductive line 140DB.

A ratio W1/W2 of the width W1 of the outermost dummy cell conductive line 140DA to the width W2 of the inner dummy cell conductive line 140DB may be greater than or equal to 1.

In the semiconductor memory device according to some example embodiments, the ratio W1/W2 of the width W1 of the outermost dummy cell conductive line 140DA to the width W2 of the inner dummy cell conductive line 140DB may be greater than or equal to 1, and may be smaller than or equal to 2.

Specifically, the ratio W1/W2 of the width W1 of the outermost dummy cell conductive line 140DA to the width W2 of the inner dummy cell conductive line 140DB may be greater than or equal to 1 and may be smaller than or equal to 1.7.

More specifically, the ratio W1/W2 of the width W1 of the outermost dummy cell conductive line 140DA to the width W2 of the inner dummy cell conductive line 140DB may be greater than or equal to 1 and may be smaller than or equal to 1.5. Description thereof will be made later using FIG. 35 to FIG. 38.

The technical idea of example embodiments are not limited to the above range of the ratio. For example, in the semiconductor memory device according to the technical idea of the present disclosure, a case is not excluded in which the ratio W1/W2 of the width W1 of the outermost dummy cell conductive line 140DA to the width W2 of the inner dummy cell conductive line 140DB exceeds 2.

In FIG. 13, none of the plurality of storage contacts 120 arranged along the first direction D1 may not include the first airgap (AG_BC of FIG. 6). Although not shown, the second airgap AG_DC may not be disposed between one of the cell conductive lines 140N, 140DA, and 140DB and each of the bit-line contacts 146 arranged in the second direction D2.

In FIG. 14, the storage contacts 120 including the first airgap AG_BC among the plurality of storage contacts 120 arranged in the first direction D1 may be discontinuously arranged. Although not shown, the second airgaps AG_DC may be arranged in a discrete manner between one normal cell conductive line 140N and the plurality of bit-line contacts 146. In this case, the plurality of storage contacts 120 arranged along the first direction D1 may not include the first airgap AG_BC.

FIG. 15 to FIG. 22 are diagrams of intermediate steps for illustrating a semiconductor memory device manufacturing method according to some example embodiments. Those of descriptions of the manufacturing method that are duplicate with those described using FIG. 1 to FIG. 14 are briefly described or omitted. Further, the description of the manufacturing method is made using a cross section cut along the lines A-A and B-B of FIG. 4.

Referring to FIG. 1 to FIG. 5, FIG. 15 and FIG. 16, the substrate 100 including the cell area 20, the peripheral area 24, and the cell area separation film 22 is provided.

Within the cell area 20, the cell element separation film 105 defining the cell active area ACT may be formed.

The cell gate structure 110 may be formed in the substrate 100 and in the cell area 20. The cell gate structure 110 may extend in an elongate manner in the first direction D1. The cell gate structure 110 may include the cell gate trench 115, the cell gate insulating film 111, the cell gate electrode 112, the cell gate capping pattern 113, and the cell gate capping conductive film 114.

Subsequently, the cell insulating film 130 may be formed on the cell area 20. The cell insulating film 130 may expose a portion of the substrate 100 in the peripheral area 24.

Subsequently, the cell conductive lines 140N, 140DA, and 140DB, and the cell line capping film 144 may be formed on a portion of the substrate 100 in the cell area 20. For example, the plurality of bit-lines BL extending in the second direction D2 may be formed on the portion of the substrate 100 in the cell area 20.

While or before or after the cell conductive lines 140N, 140DA, and 140DB and the cell line capping film 144 are being formed, the peripheral gate conductive film 240 and the peripheral capping film 244 may be formed. An insulating material film including the peripheral capping film 244, the lower etch stop film 250, and the upper peripheral interlayer insulating film 291 may be patterned to form the cell line capping film 144.

While or before or after the cell conductive lines 140N, 140DA, and 140DB and the cell line capping film 144 are being formed, the bit-line contact 146 may be formed.

Subsequently, the cell line spacer 150 may be formed. While the fourth cell line spacer 154 is formed, a storage contact recess 120R may be formed between the cell conductive lines 140N, 140DA, and 140DB adjacent to each other in the first direction D1.

Subsequently, a first semiconductor material film 121 may be formed on the substrate 100. The first semiconductor material film 121 may include a semiconductor material containing impurities, such as but not limited to at least one of boron, phosphorus, or arsenic.

The first semiconductor material film 121 may cover the cell conductive lines 140N, 140DA, and 140DB. The first semiconductor material film 121 may cover an upper surface of the cell line capping film 144 and an upper surface of the upper peripheral interlayer insulating film 291. The first semiconductor material film 121 may cover an upper surface of the cell gate capping pattern 113.

The first semiconductor material film 121 may fill the storage contact recess 120R. The first semiconductor material film 121 may fill a space between the cell conductive lines 140N, 140DA, and 140DB adjacent to each other in the first direction D1.

Figure 17:
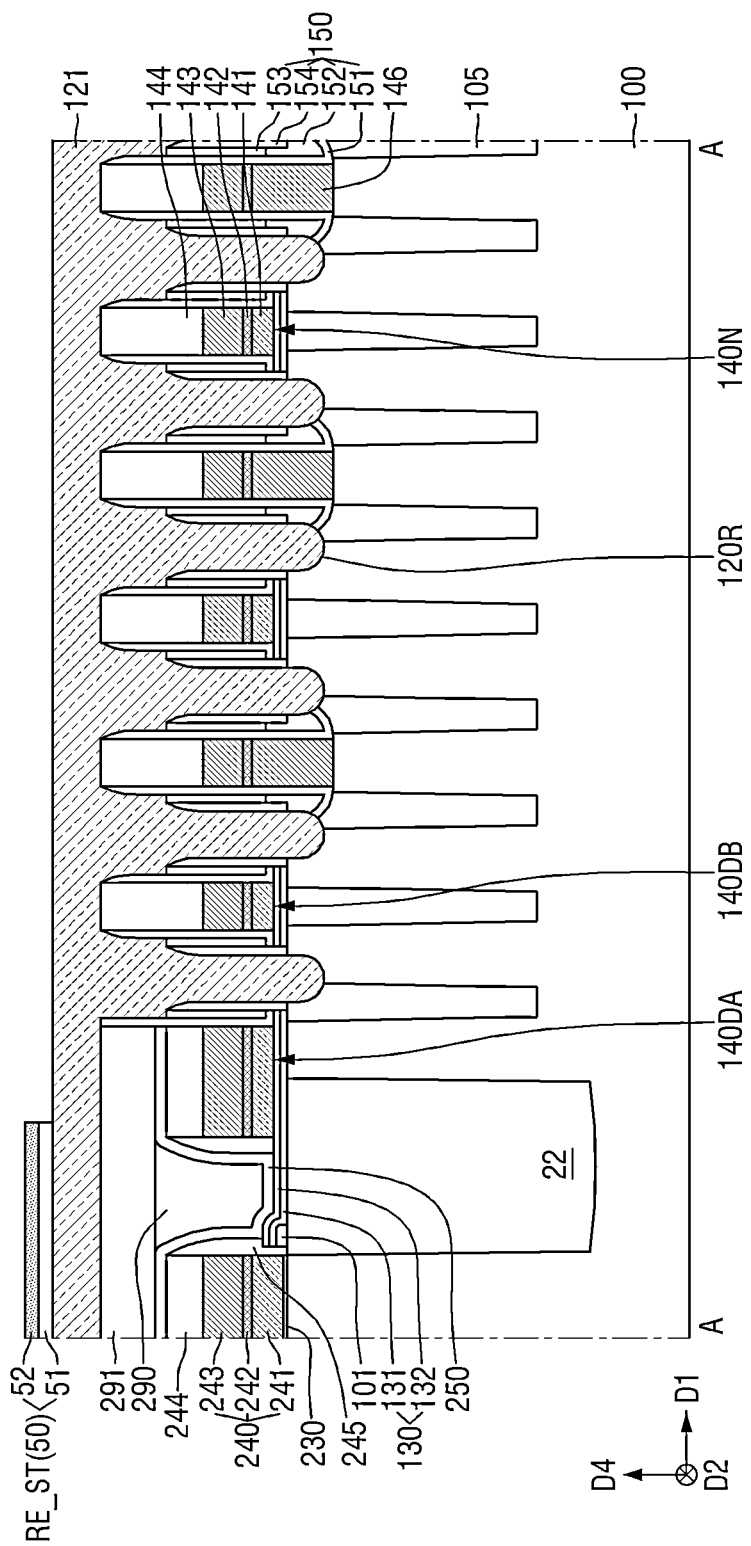
Figure 18:
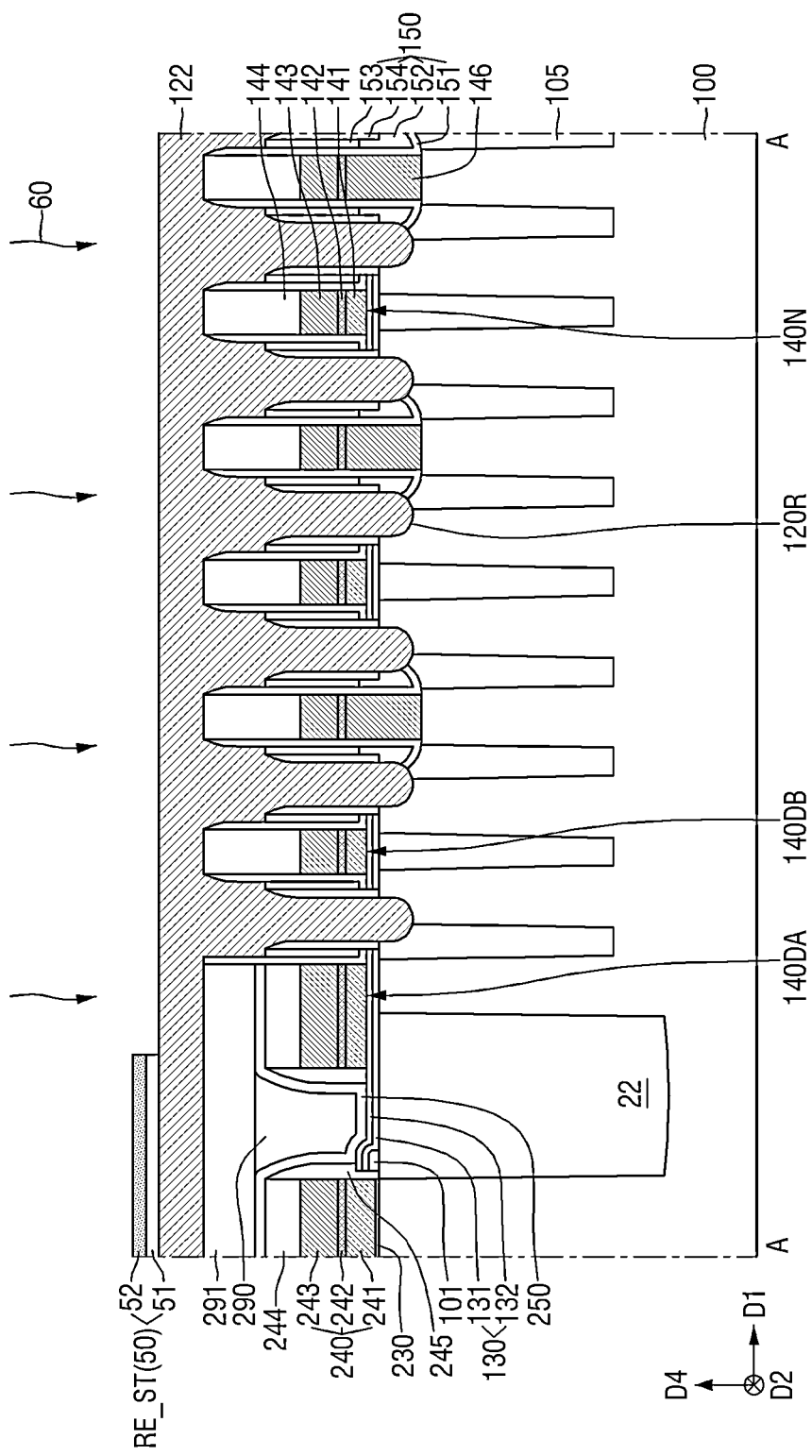
Figure 19:
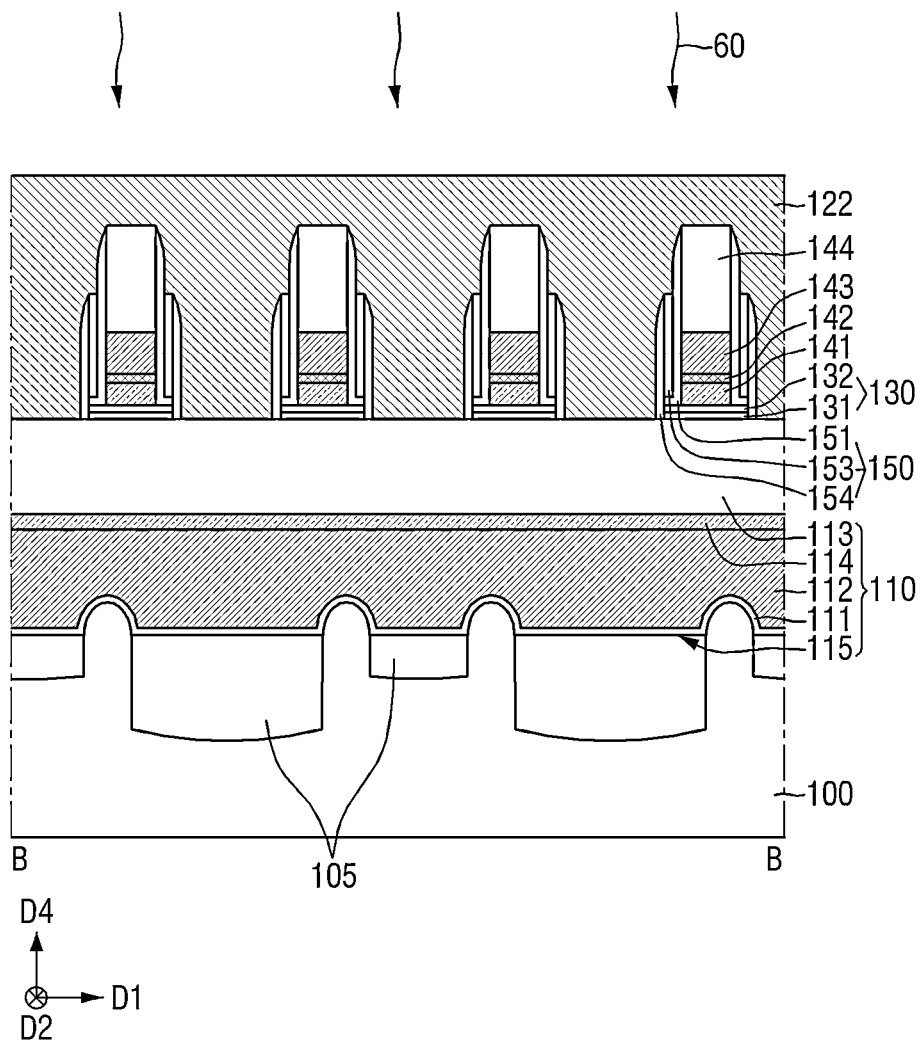

Referring to FIG. 4 and FIG. 17, a reflective film 50 may be formed on the first semiconductor material film 121.

The reflective film 50 may be formed on the peripheral area 24. The reflective film 50 may overlap the peripheral area 24 in the fourth direction D4. The reflective film 50 may overlap at least a portion of the cell area separation film 22 in the fourth direction D4. The reflective film 50 may not overlap the cell area 20 in the fourth direction D4.

Unlike a configuration illustrated, in some other example embodiments, the reflective film 50 may not overlap the cell area separation film 22 in the fourth direction D4. In some example embodiments, the reflective film 50 may not overlap a portion of the peripheral area 24 in the fourth direction D4. In some example embodiments, at least a portion of the cell area 20 does not overlap the reflective film 50 in the fourth direction D4. A portion of the cell area 20 overlaps the reflective film 50 in the fourth direction D4, and the remainder of the cell area 20 does not overlap the reflective film 50 in the fourth direction D4.

The reflective film 50 may be made of or may include or may consist of insulating material. The reflective film 50 may include, for example, a reflective structure RE_ST.

The reflective structure RE_ST may include a lower reflective film 51 and an upper reflective film 52 sequentially stacked on the first semiconductor material film 121. An upper surface of the reflective film 50 may be defined by the upper reflective film 52.

The lower reflective film 51 may be made of an insulating material having a first refractive index. The upper reflective film 52 may be made of an insulating material having a second refractive index greater than the first refractive index. Each of the first refractive index and the second refractive index is smaller than a refractive index of the first semiconductor material film 121.

For example, the upper reflective film 52 may include silicon nitride or hafnium oxide. Example embodiments are not limited thereto. Although the lower reflective film 51 may include silicon oxide or TEOS (Tetraethyl orthosilicate), example embodiments are not limited thereto.

In a semiconductor memory device manufacturing method according to some example embodiments, the reflective film 50 may include a pair of a lower reflective film 51 and an upper reflective film 52.

Each of a thickness of the lower reflective film 51 and a thickness of the upper reflective film 52 may vary depending on a wavelength of laser used in a laser annealing process (60 in FIG. 18) that is subsequently performed. Further, the thickness of the lower reflective film 51 may vary depending on a refractive index of an insulating material included in the lower reflective film 51. The thickness of the upper reflective film 52 may vary depending on a refractive index of an insulating material included in the upper reflective film 52.

Referring to FIG. 4, FIG. 17 to FIG. 19, the laser may be irradiated onto the first semiconductor material film 121 on which the reflective film 50 has been formed. The laser annealing process 60 using the reflective film 50 may be performed.

Using the laser annealing process 60, a second semiconductor material film 122 may be formed on the substrate 100. The second semiconductor material film 122 may be formed by recrystallizing the first semiconductor material film 121. The first semiconductor material film 121 is heated and melted by the laser irradiated onto the first semiconductor material film 121, such that the first semiconductor material film 121 may be recrystallized.

Although not shown, the first void or the first seam or the first airgap (AG_BC of FIG. 6) may be formed in or within the second semiconductor material film 122. Alternatively or additionally, the second airgap AG_DC may be formed between each of the cell conductive lines 140N, 140DA, and 140DB and the bit-line contact 146.

When the laser annealing process 60 is performed without the reflective film 50, excess heat may be generated in the vicinity of the cell area separation film 22. In this case, the heat generated from the laser annealing process 60 may flow to the cell area 20 forming a boundary with the cell area separation film 22. For example, inside the first semiconductor material film 121, a heat flow from the peripheral area 24 to the cell area 20 may be generated. Thus, the heat flow may affect the bit-line contact 146 made of a semiconductor material near the boundary of the cell area 20. For example, a defect may be generated between the bit-line contact 146 disposed near the boundary of the cell area 20 and the normal cell conductive line 140N.

On the contrary, an amount of the laser energy absorbed by a portion of the first semiconductor material film 121 on which the reflective film 50 is formed is smaller than or less than an amount of the laser energy absorbed by a portion of the first semiconductor material film 121 on which the reflective film 50 is not formed. For example, using the reflective film 50 in the laser annealing process 60 may allow preventing or reducing occurrence of and/or impact from the excess heat in the vicinity of the cell area separation film 22. This may prevent or reduce occurrence of and/or impact from the heat flow from the peripheral area 24 to the cell area 20 inside the first semiconductor material film 121.

Referring to FIG. 4, FIG. 20 to FIG. 22, the reflective film 50 on the second semiconductor material film 122 may be removed.

A portion of the second semiconductor material film 122 may be removed to expose the cell line capping film 144.

The second semiconductor material film 122 may be patterned to form the storage contact 120 on the substrate 100 and in the cell area 20. The storage contact 120 may be connected to the active area ACT of the cell area 20.

The fence pattern 170 may be formed on the cell gate structure 110. The fence pattern 170 may fill a space in which the second semiconductor material film 122 is removed.

Then, referring to FIG. 6 and FIG. 7, the storage pad 160 may be formed on the storage contact 120. Further, the information storage 190 connected to the storage pad 160 may be formed.

FIG. 23 to FIG. 26 are diagrams for illustrating a semiconductor memory device manufacturing method according to some example embodiments, respectively.

Figure 15:
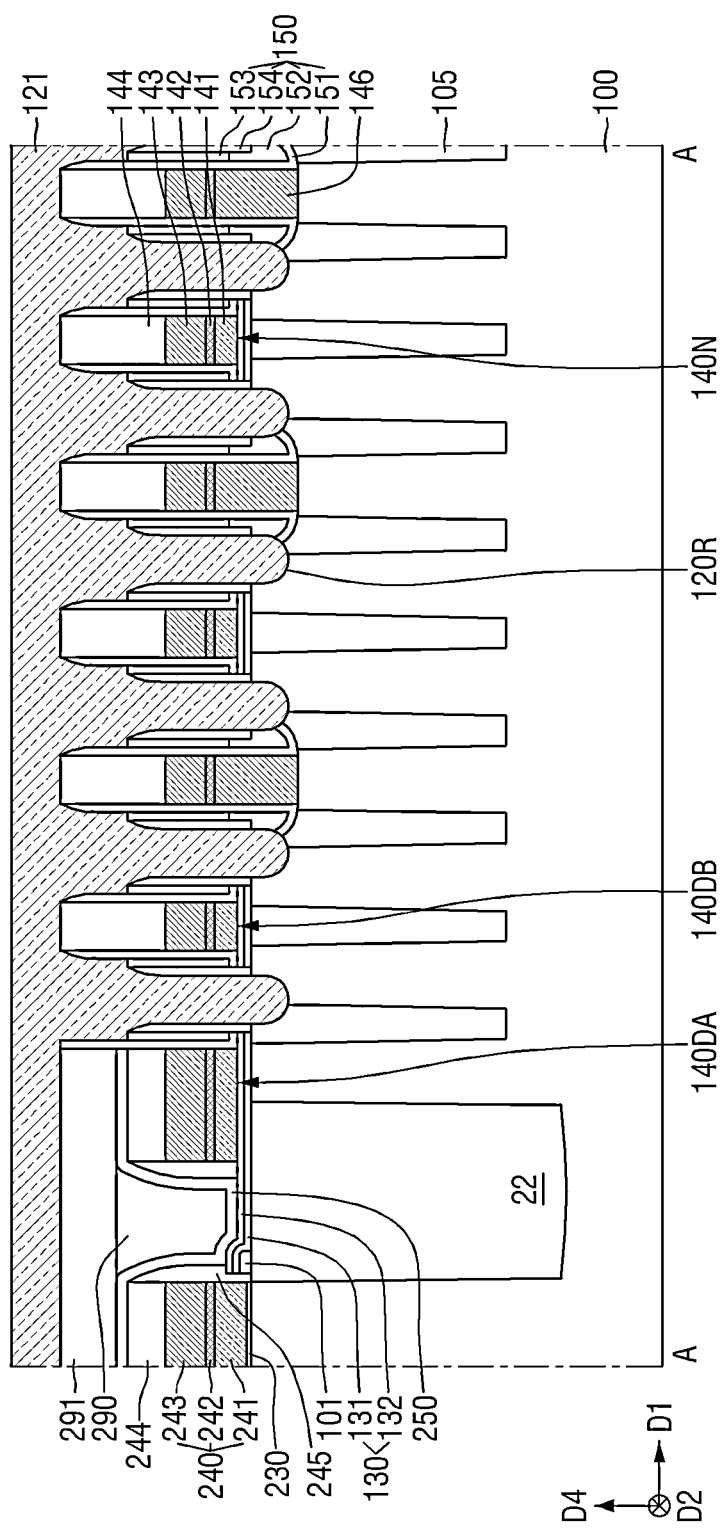
FIG. 15 to FIG. 22 are diagrams of intermediate steps for illustrating a semiconductor memory device manufacturing method according to some example embodiments.
Figure 16:
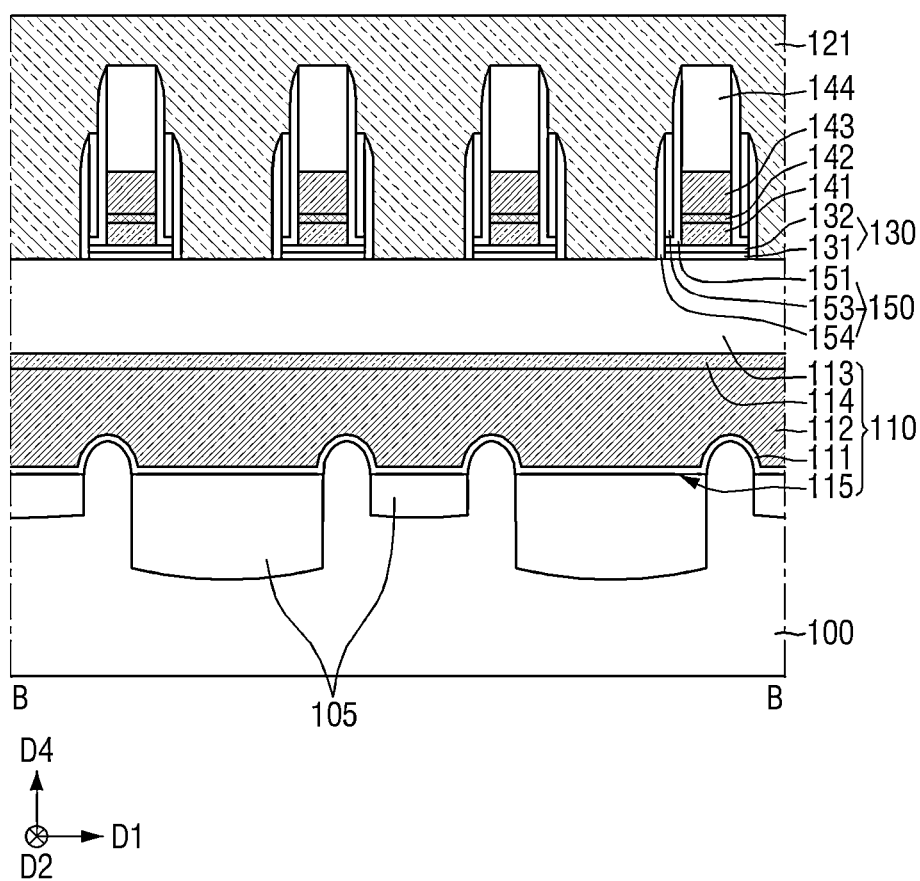

For reference, each of FIG. 23 to FIG. 26 may refer to a manufacturing process performed after FIG. 15 and FIG. 16. Further, after each of FIG. 23 to FIG. 26 is performed, the manufacturing process as described in FIG. 18 to FIG. 22 may proceed.

Figure 23:
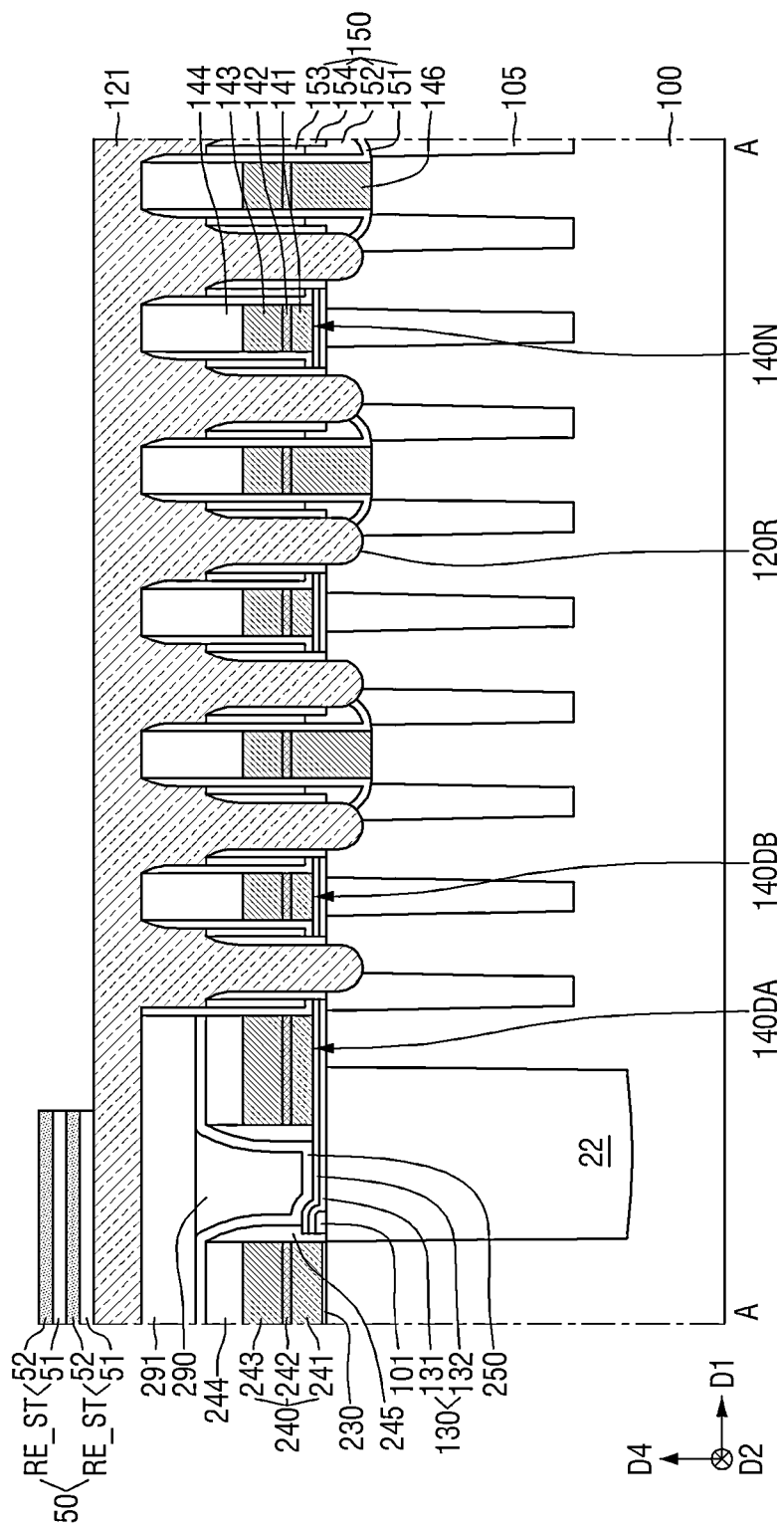
FIG. 23 to FIG. 26 are diagrams for illustrating a semiconductor memory device manufacturing method according to some example embodiments.

Referring to FIG. 23, the reflective film 50 may include a plurality of reflective structures RE_ST.

The reflective film 50 may include a plurality of lower reflective films 51 and a plurality of upper reflective films 52. The reflective film 50 may include a plurality of lower reflective film 51 and a plurality of upper reflective film 52 alternately stacked on the first semiconductor material film 121.

Figure 24:
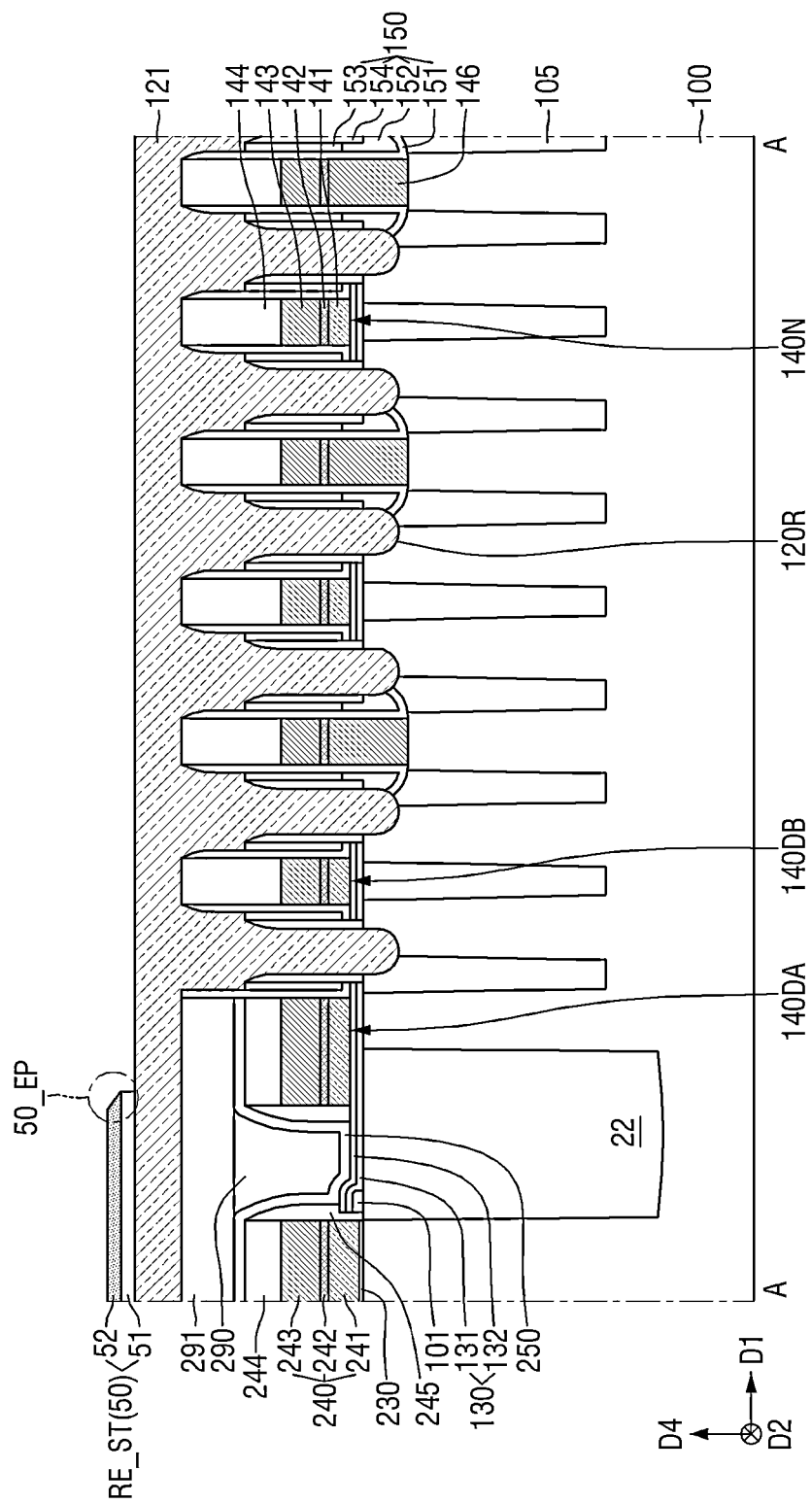
Figure 25:
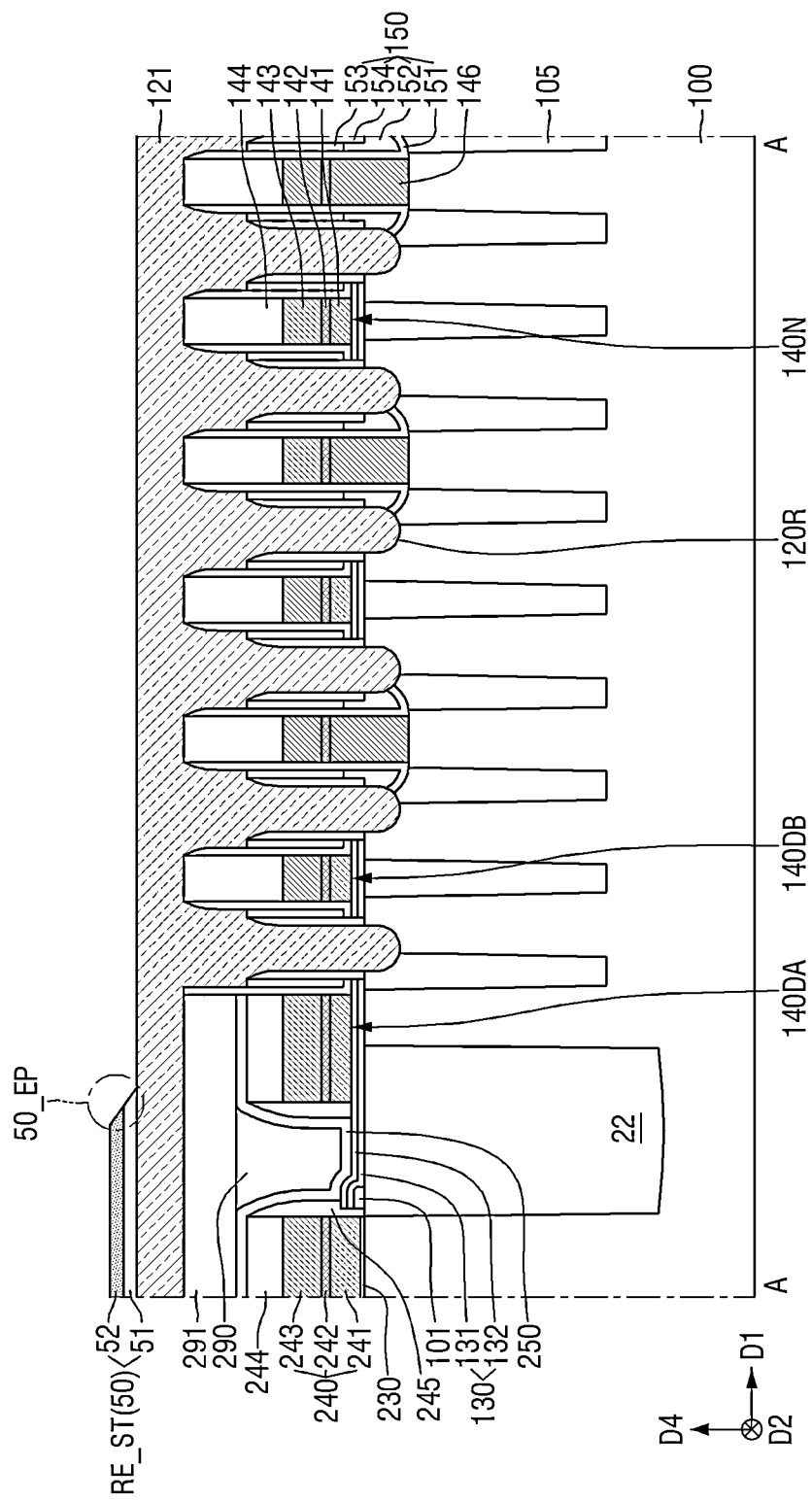

Referring to FIG. 24 and FIG. 25, the reflective film 50 may include an end 50_EP of the reflective film having a chamfered shape.

The end 50_EP of the reflective film may have a chamfered shape. The end 50_EP of the reflective film may be tapered.

In FIG. 24, the upper reflective film 52 may have a chamfered shape. The lower reflective film 51 may not have a chamfered shape.

In FIG. 25, each of the upper reflective film 52 and the lower reflective film 51 may have a chamfered shape. A pair of reflective structures RE_ST may have a chamfered shape.

Figure 26:
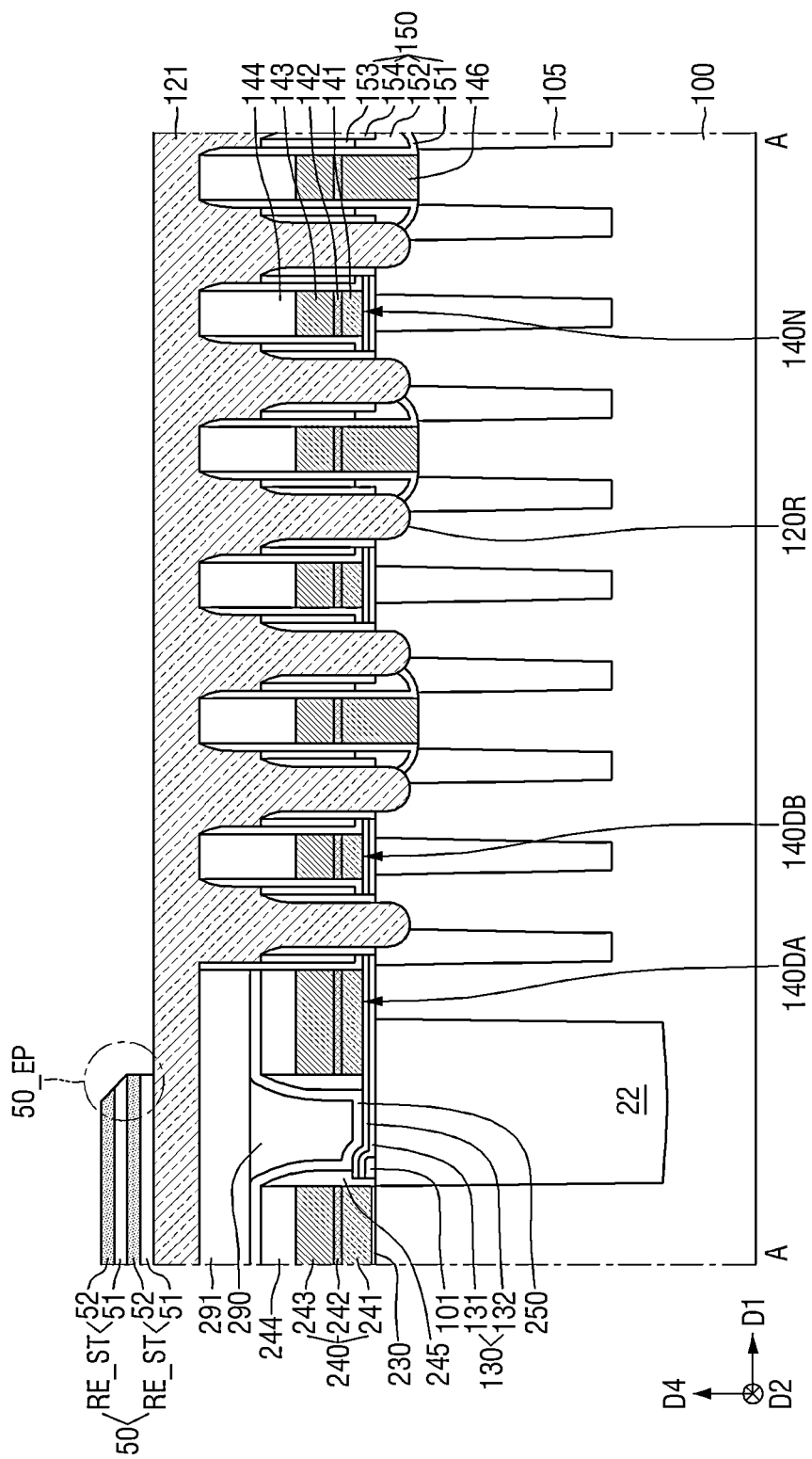

Referring to FIG. 26, the reflective film 50 including the plurality of reflective structures RE_ST may include an end 50_EP of the reflective film having a chamfered shape.

An end of at least one of the plurality of reflective structures RE_ST may have a chamfered shape. For example, the reflective film 50 may include a reflective structure RE_ST having a chamfered shape or a beveled shape at an end thereof and a reflective structure RE_ST free of chamfered shape or beveled shape at an end thereof.

Unlike a configuration as shown, in one example, all of reflective structures RE_ST included in the reflective film 50 may include an end having a chamfered shape or a beveled shape. In another example, in a reflective structure RE_ST having an end of a chamfered shape, the upper reflective film 52 may have a chamfered shape, and the lower reflective film 51 may not have a chamfered shape.

FIG. 27 to FIG. 30 are diagrams of intermediate steps for illustrating a semiconductor memory device manufacturing method according to some example embodiments. For reference, FIG. 27 to FIG. 30 may refer to a manufacturing process performed after FIG. 15 and FIG. 16.

Figure 27:
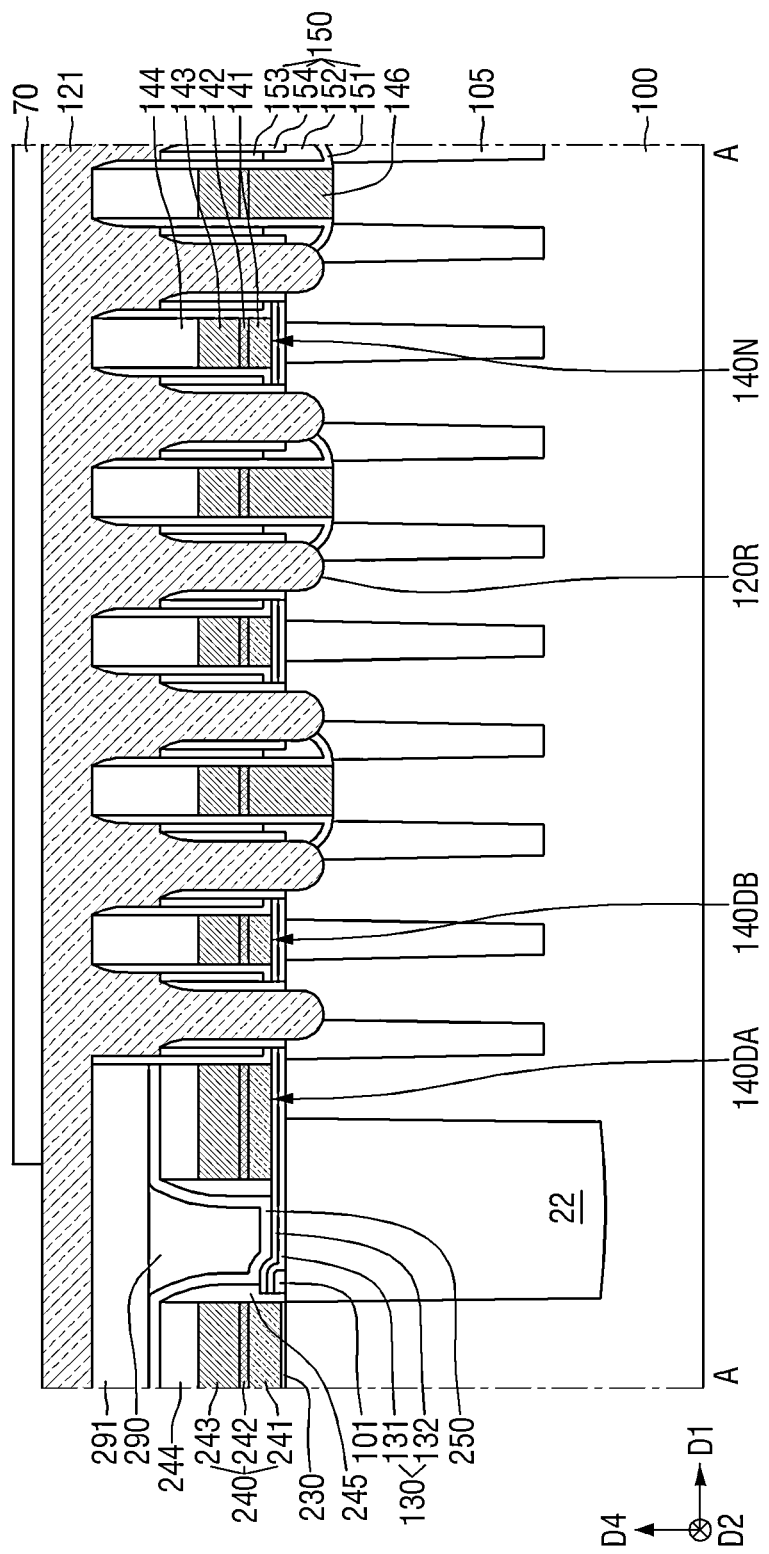
FIG. 27 to FIG. 30 are diagrams of intermediate steps for illustrating a semiconductor memory device manufacturing method according to some example embodiments.
Figure 28:
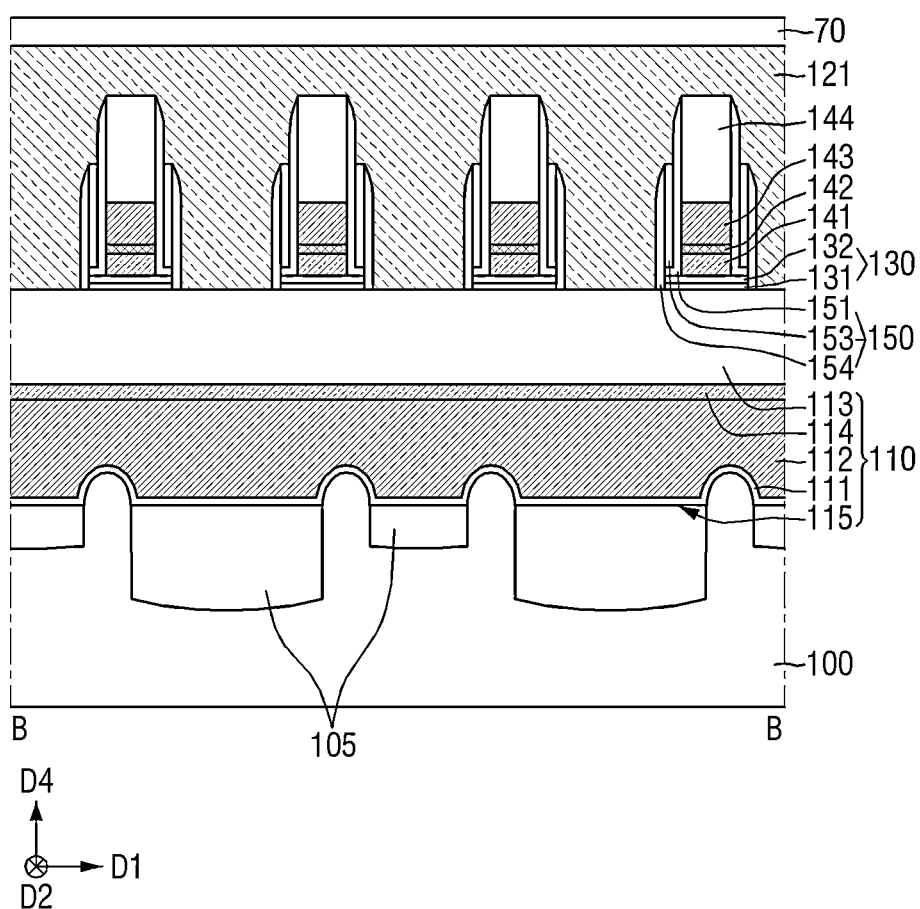

Referring to FIG. 4, FIG. 27, and FIG. 28, an anti-reflective film 70 may be formed on the first semiconductor material film 121.

The anti-reflective film 70 may be formed on the cell area 20. The anti-reflective film 70 may overlap the cell area 20 in the fourth direction D4. The anti-reflective film 70 may overlap at least a portion of the cell area separation film 22 in the fourth direction D4. The anti-reflective film 70 may not overlap the peripheral area 24 in the fourth direction D4.

Unlike a configuration as illustrated, in an example, the anti-reflective film 70 may not overlap the cell area separation film 22 in the fourth direction D4. In another example, the anti-reflective film 70 may not overlap a portion of the cell area 20 in the fourth direction D4. In another example, at least a portion of the peripheral area 24 does not overlap the anti-reflective film 70 in the fourth direction D4. A portion of the peripheral area 24 may not overlap the anti-reflective film 70 in the fourth direction D4, and the remainder of the peripheral area 24 may overlap the anti-reflective film 70 in the fourth direction D4.

The anti-reflective film 70 may be made of insulating material. The anti-reflective film 70 may be formed of, for example, a single film. A refractive index of the anti-reflective film 70 is smaller than a refractive index of the first semiconductor material film 121. Although the anti-reflective film 70 may include, for example, silicon oxide, example embodiments are not limited thereto.

Reflectivity at which the anti-reflective film 70 reflects the laser used in the laser annealing process (60 in FIG. 29) may vary based on a thickness of the anti-reflective film 70. The thickness of the anti-reflective film 70 may be determined based on the reflectivity at which the anti-reflective film 70 reflects the laser used in the laser annealing process 60.

Unlike a configuration as shown, the anti-reflective film 70 may include an end having a chamfered shape as shown in FIG. 24 to FIG. 26.

Figure 29:
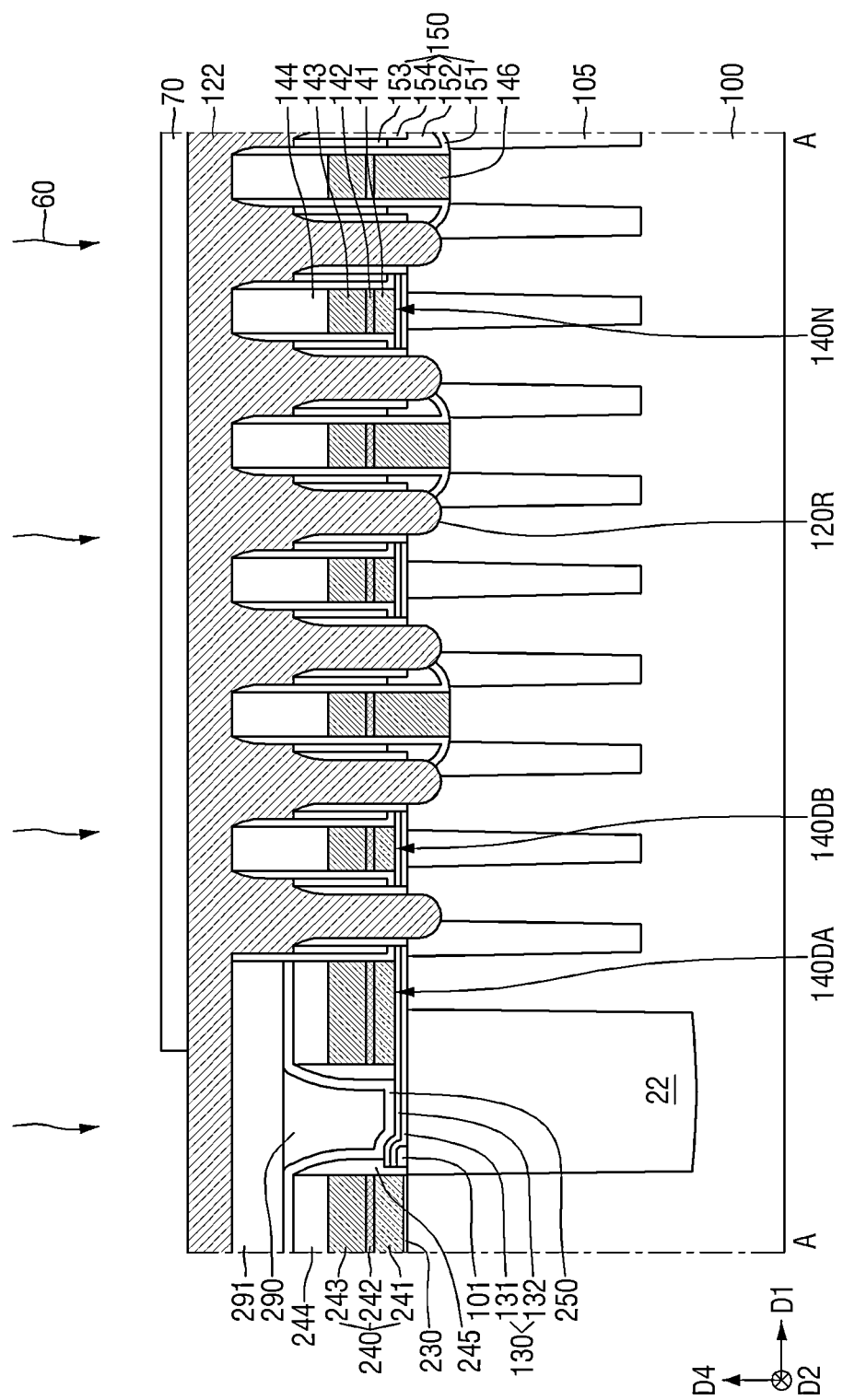
Figure 30:
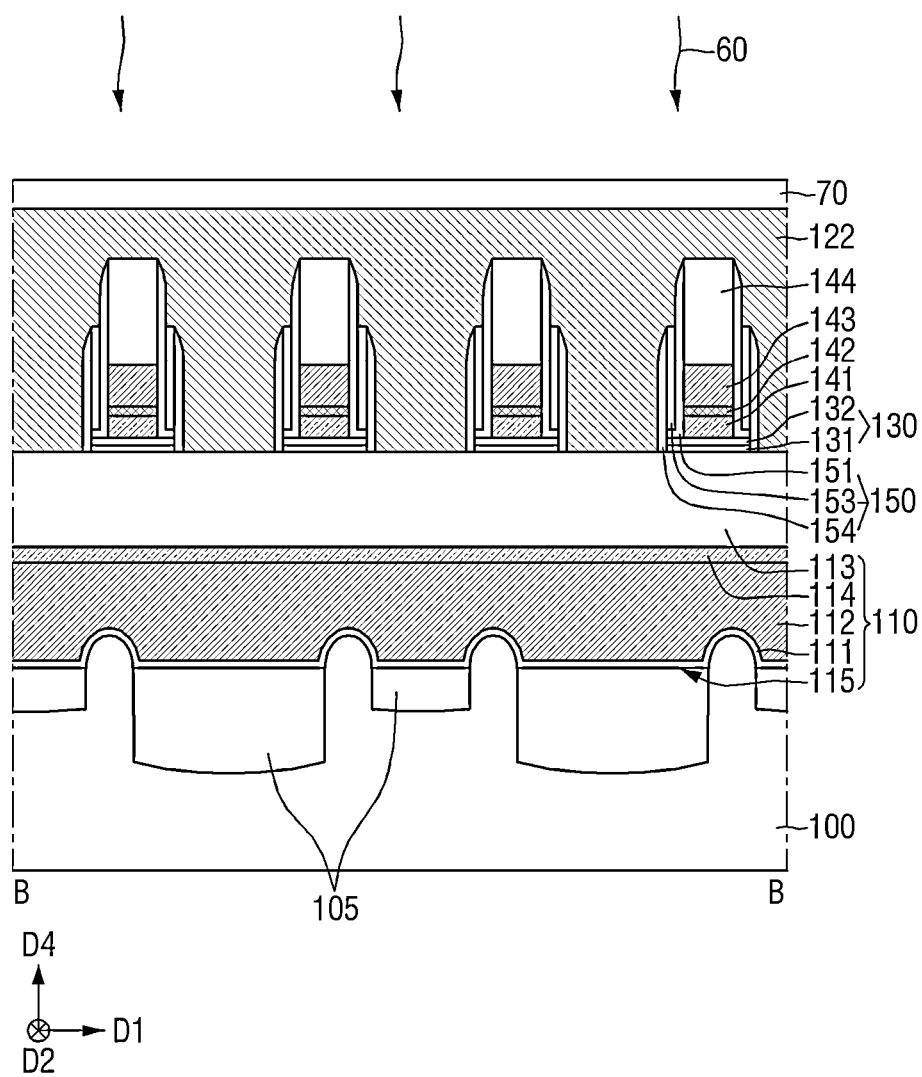

Referring to FIG. 4, FIG. 29, and FIG. 30, the laser may be irradiated onto the first semiconductor material film 121 on which the anti-reflective film 70 has been formed. The laser annealing process 60 using the anti-reflective film 70 may be performed.

Using the laser annealing process 60, the first semiconductor material film 121 may be recrystallized, such that the second semiconductor material film 122 may be formed on the substrate 100.

Although not shown, the first airgap (AG_BC of FIG. 6) may be formed in the second semiconductor material film 122. Alternatively or additionally, the second airgap AG_DC may be formed between each of the cell conductive lines 140N, 140DA, and 140DB and the bit-line contact 146.

An amount of laser energy absorbed by a portion of the first semiconductor material film 121 on which the anti-reflective film 70 is formed is greater than an amount of laser energy absorbed by a portion of the first semiconductor material film 121 on which the anti-reflective film 70 is not formed. For example, using the anti-reflective film 70 in the laser annealing process 60 may allow preventing or reducing occurrence of and/or impact from excess heat in the vicinity of the cell area separation film 22. This may prevent or reduce occurrence of and/or impact from heat flow from the peripheral area 24 to the cell area 20 inside the first semiconductor material film 121.

Figure 20:
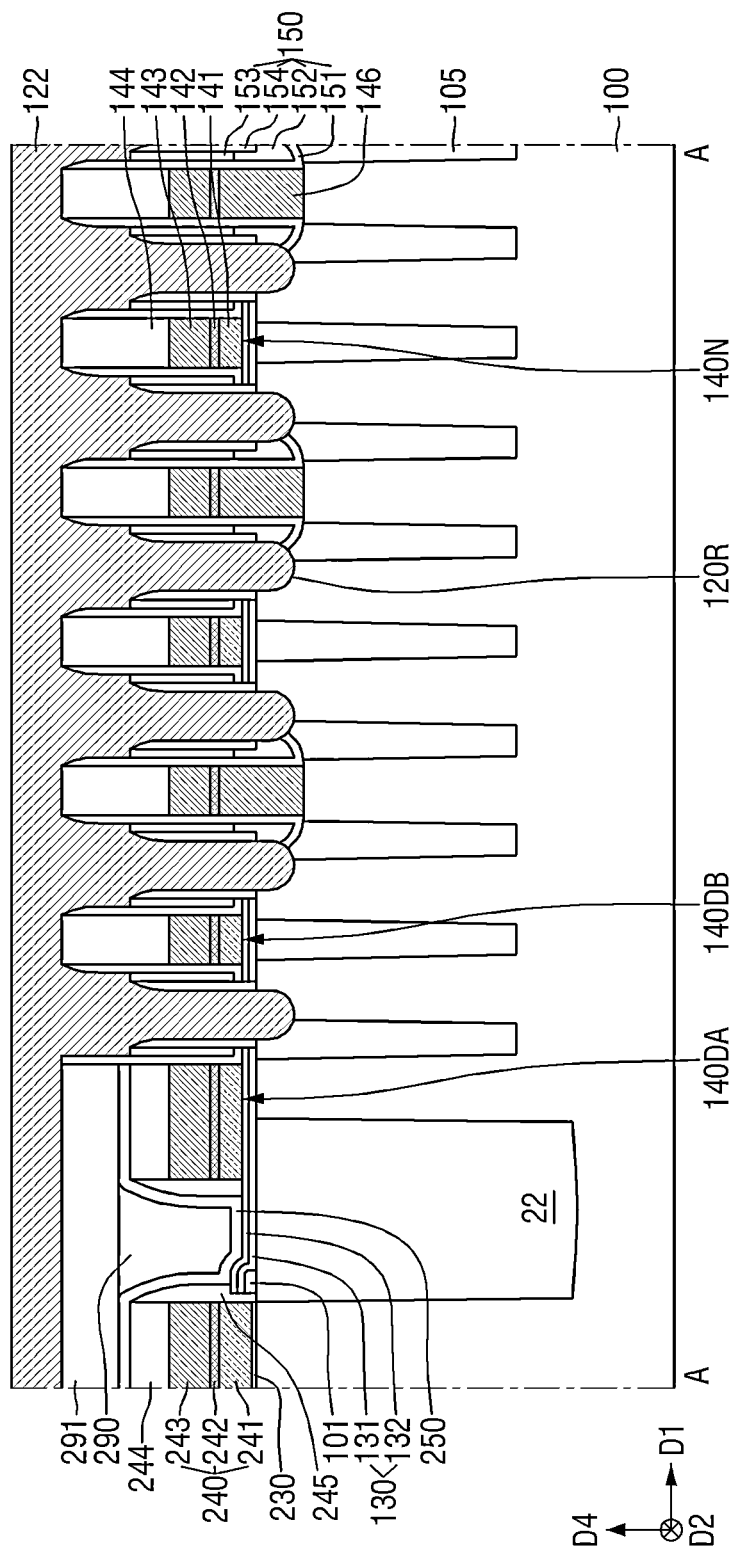
Figure 21:
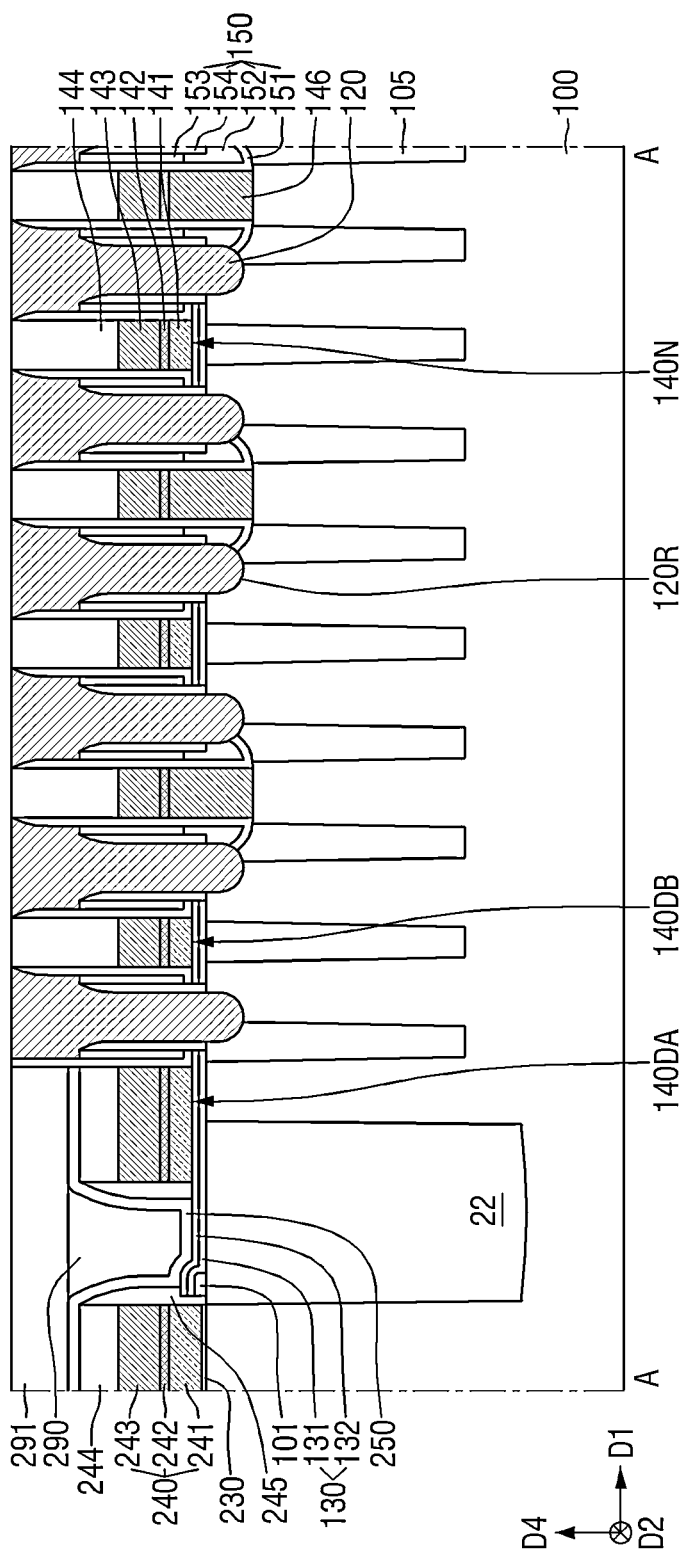
Figure 22:
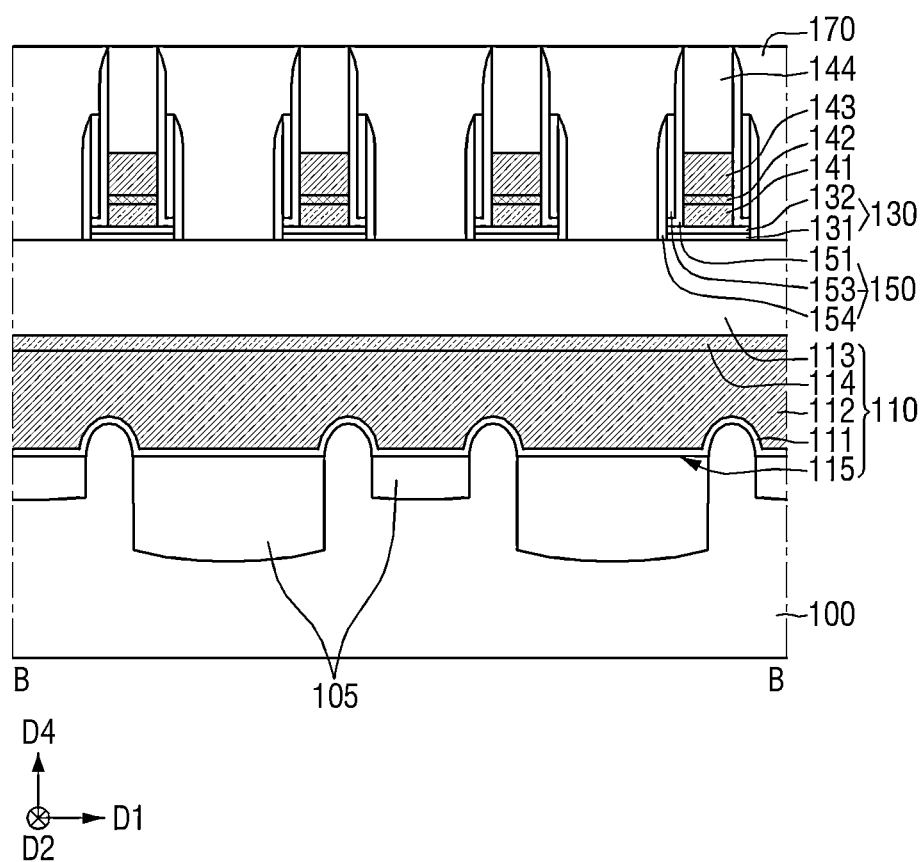

Subsequently, referring to FIG. 20 to FIG. 22, the anti-reflective film 70 on the second semiconductor material film 122 may be removed. Subsequently, the second semiconductor material film 122 may be patterned to form the storage contact 120 on the substrate 100 and in the cell area 20.

Figure 31:
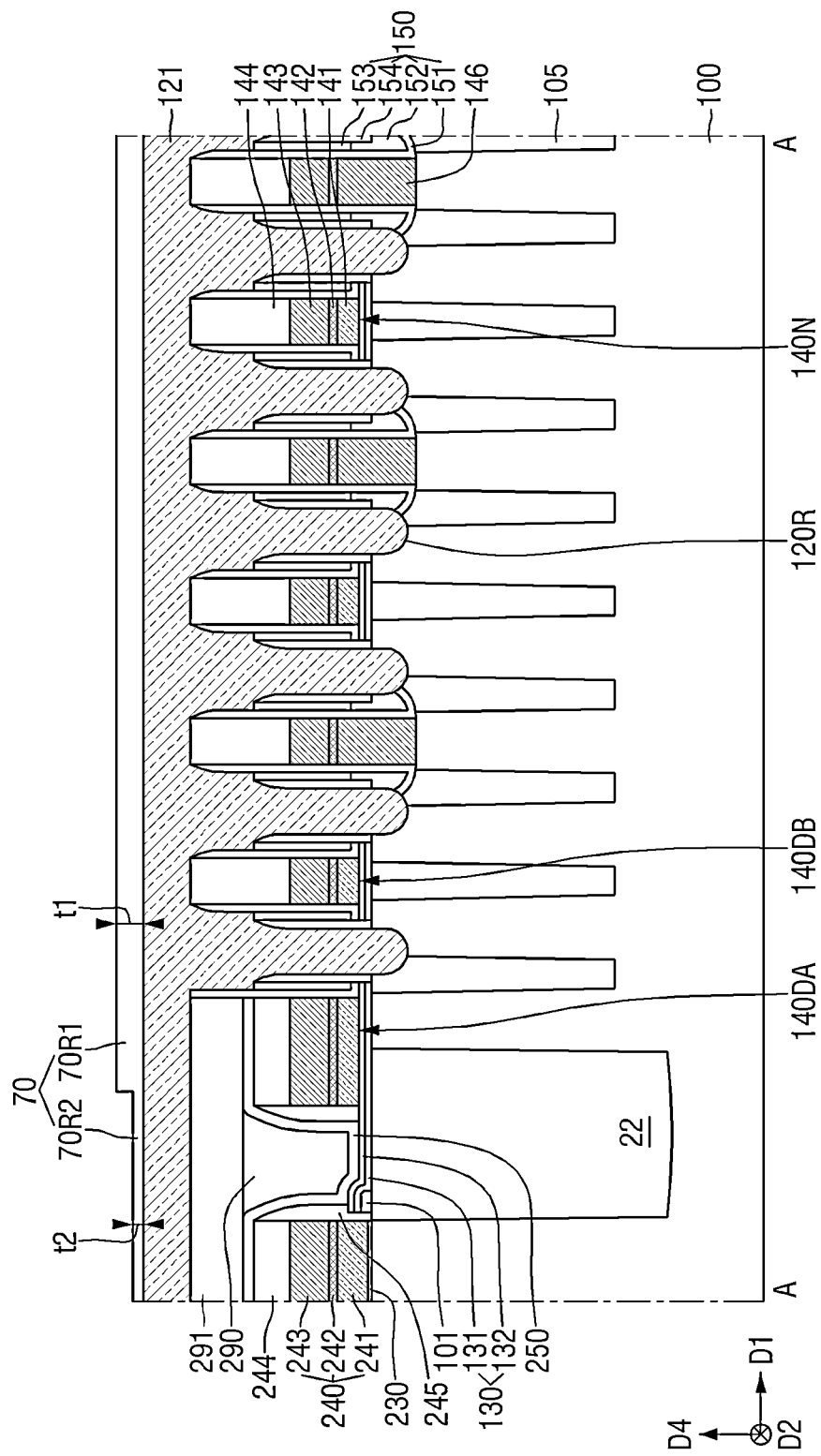
FIG. 31 and FIG. 32 are diagrams for illustrating a semiconductor memory device manufacturing method according to some example embodiments, respectively.
Figure 32:
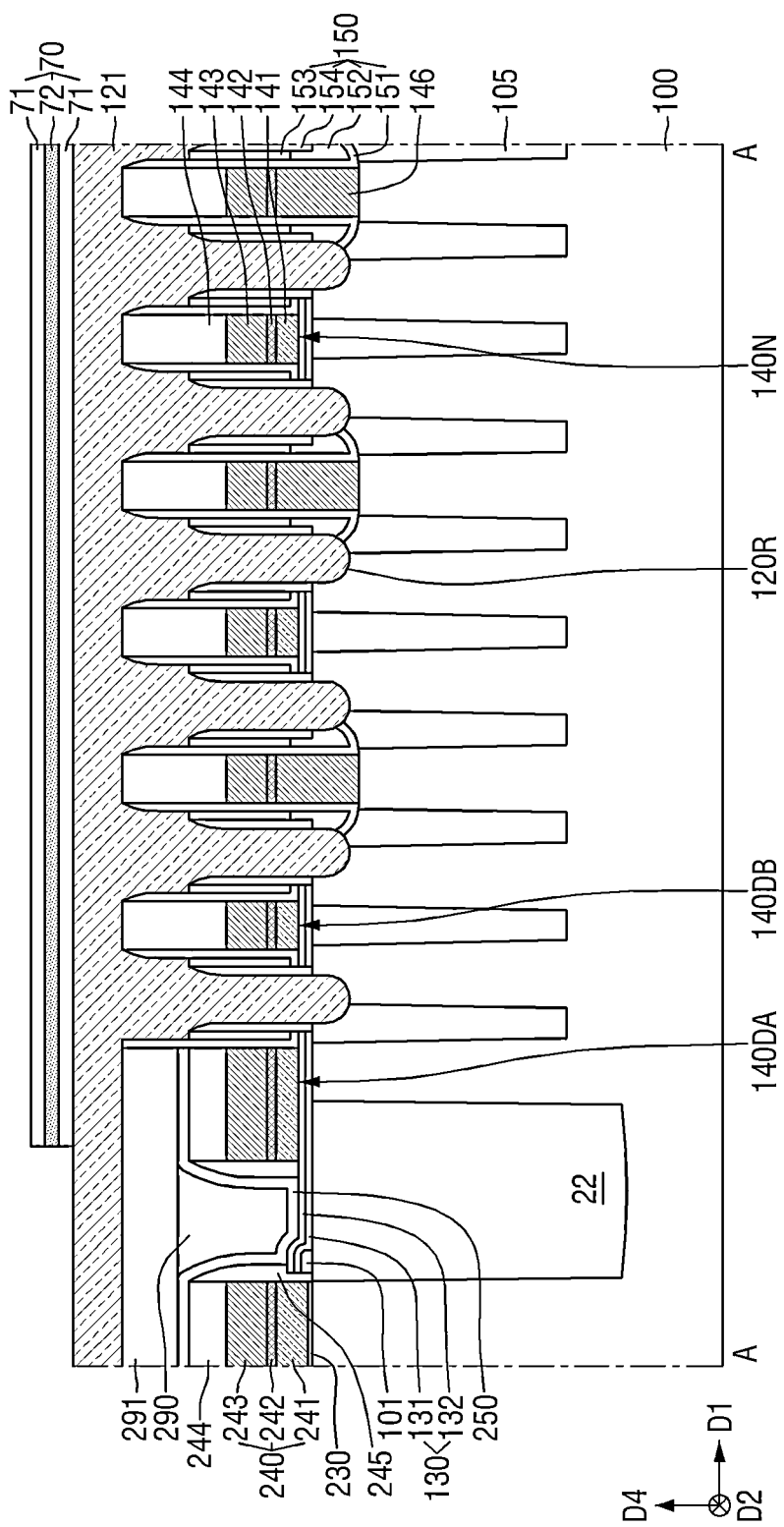

FIG. 31 and FIG. 32 are diagrams for illustrating a semiconductor memory device manufacturing method according to some example embodiments, respectively.

For reference, each of FIG. 31 and FIG. 32 may refer to a manufacturing process performed after FIG. 15 and FIG. 16. Further, after each of FIG. 31 and FIG. 32 is performed, the manufacturing process described in FIG. 29 and FIG. 30 may proceed.

Referring to FIG. 31, the anti-reflective film 70 may include a first area 70R1 having a first thickness t1 and a second area 70R2 having a second thickness t2.

The first area 70R1 of the anti-reflective film may be formed on the cell area 20. The first area 70R1 of the anti-reflective film may overlap the cell area 20 in the fourth direction D4. The first area 70R1 of the anti-reflective film may overlap with at least a portion of the cell area separation film 22 in the fourth direction D4. The first area 70R1 of the anti-reflective film may not overlap the peripheral area 24 in the fourth direction D4.

The second area 70R2 of the anti-reflective film may be formed on the peripheral area 24. The second area 70R2 of the anti-reflective film may overlap peripheral area 24 in the fourth direction D4.

For example, the thickness t1 of the first area 70R1 of the anti-reflective film is greater than the thickness t2 of the second area 70R2 of the anti-reflective film. Reflectivity of the anti-reflective film 70 having the first thickness t1 is smaller than Reflectivity of the anti-reflective film 70 having the second thickness t2.

Unlike a configuration as illustrated, the thickness t1 of the first area 70R1 of the anti-reflective film may be smaller than the thickness t2 of the second area 70R2 of the anti-reflective film. Even in this case, the reflectivity of the anti-reflective film 70 having the first thickness t1 is smaller than the reflectivity of the anti-reflective film 70 having the second thickness t2.

Referring to FIG. 32, the anti-reflective film 70 may include the first anti-reflective films 71 and the second anti-reflective films 72 that are alternately stacked.

The anti-reflective film 70 may include at least one first anti-reflective film 71 and a plurality of second anti-reflective films 72. The number of the second anti-reflective films 72 is greater than the number of the first anti-reflective films 71 by one. A portion of the anti-reflective film 70 closest to the first semiconductor material film 121 may be the first anti-reflective film 71. An upper surface of the anti-reflective film 70 may be defined by the first anti-reflective film 71.

The first anti-reflective film 71 may be made of an insulating material having a third refractive index. The second anti-reflective film 72 may be made of an insulating material having a fourth refractive index greater than the third refractive index. Each of the third refractive index and the fourth refractive index is smaller than the refractive index of the first semiconductor material film 121.

Each of a thickness of the first anti-reflective film 71 and a thickness of the second anti-reflective film 72 may vary depending on a wavelength of the laser used in the laser annealing process (60 in FIG. 29). Further, the thickness of the first anti-reflective film 71 may vary based on a refractive index of an insulating material included in the first anti-reflective film 71. The thickness of the second anti-reflective film 72 may vary based on a refractive index of an insulating material included in the second anti-reflective film 72.

In some examples, the first anti-reflective films 71 respectively disposed on an upper surface and a bottom surface of the second anti-reflective film 72 may include the same material.

In other examples, the first anti-reflective films 71 respectively disposed on an upper surface and a bottom surface of the second anti-reflective film 72 may include different materials. For example, the first anti-reflective film 71 between the second anti-reflective film 72 and the first semiconductor material film 121 may include a material different from a material of the first anti-reflective film 71 disposed on an upper surface of the second anti-reflective film 72.

Figure 33:
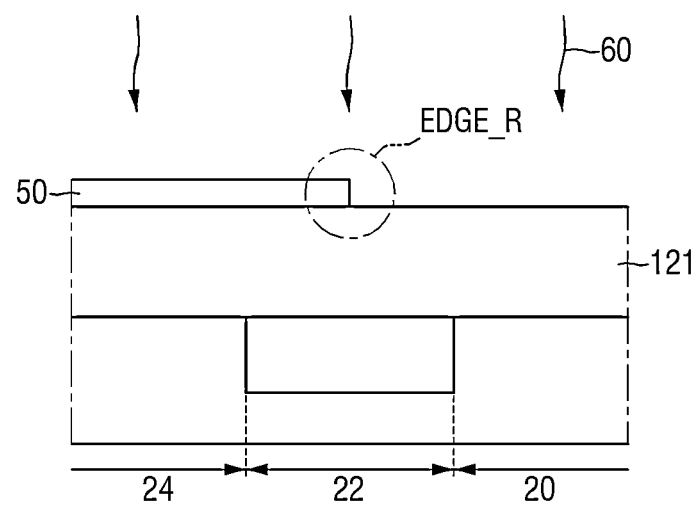
FIG. 33 and FIG. 34 are diagrams for illustrating edge diffraction.
Figure 34:
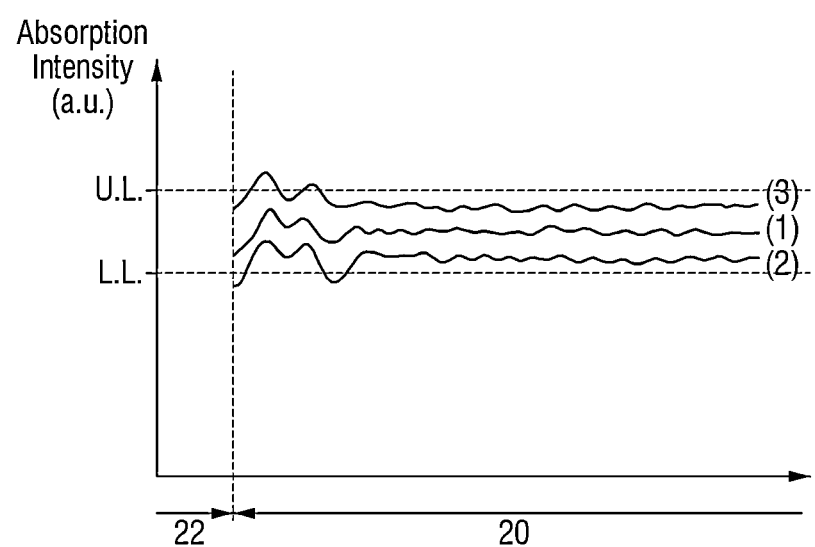

FIG. 33 and FIG. 34 are diagrams for illustrating edge diffraction.

In FIG. 33, the first semiconductor material film 121 may be formed on the substrate 100 including the cell area 20, the cell area separation film 22, and the peripheral area 24. The reflective film 50 may be formed on the first semiconductor material film 121.

The reflective film 50 is disposed on a portion of the first semiconductor material film 121 in one side area around an end of the reflective film 50 and is not disposed on a portion of the first semiconductor material film 121 in the other side area around the end of the reflective film 50. For example, a refractive index of a medium through which the laser used in the laser annealing process 60 propagates rapidly changes at the end of the reflective film 50. That is, edge diffraction may be generated in a boundary portion EDGE_R of the reflective film 50.

In FIG. 33 and FIG. 34, fluctuation in an intensity of laser energy absorbed by a portion of the first semiconductor material film 121 on the cell area 20 may occur at a boundary of the cell area 20 and the cell area separation film 22 due to the edge diffraction. As the cell area 20 extends away from the boundary between the cell area and the cell area separation film 22, the intensity of laser energy absorbed by the portion of the first semiconductor material film 121 on the cell area 20 may converge to a constant value.

In FIG. 34, when the intensity of laser energy absorbed by the first semiconductor material film 121 is greater than an upper limit U.L. of absorption intensity, the first semiconductor material film 121 may be overheated. In this case, the second airgap AG_DC as described in FIG. 10 and FIG. 11 may be formed.

When the intensity of the laser energy absorbed by the first semiconductor material film 121 is less than a lower limit L.L of the absorption intensity, the first semiconductor material film 121 may not be heated such that the first semiconductor material film 121 is entirely melted. In this case, the first airgap AG_BC as described in FIG. 6 to FIG. 9 may be formed.

When the intensity of laser energy absorbed by the first semiconductor material film 121 is indicated by (1) in FIG. 34, the intensity of laser energy absorbed by the portion of the first semiconductor material film 121 on the cell area 20 may be located between the upper limit U.L. and the lower limit L.L. of absorption intensity. In this case, both the first airgap (AG_BC of FIG. 6) and the second airgap (AG_DC of FIG. 11) may not be formed.

When the intensity of laser energy absorbed by the first semiconductor material film 121 is indicated by (2) in FIG. 34, the intensity of laser energy absorbed by a portion of the first semiconductor material film 121 on a portion of the cell area 20 may be lower than the lower limit L.L of the absorption intensity. Since the intensity of laser energy absorbed by the first semiconductor material film 121 has a wave form, points at which the intensity of laser energy is lower than the lower limit L.L. of absorption intensity may be arranged discontinuously in the portion of the cell area 20. In this case, the storage contacts 120 containing therein the first airgap AG_BC may be arranged in a discrete manner as shown in When the intensity of the laser energy absorbed by the first semiconductor material film 121 is indicated by (3) in FIG. 34, the intensity of laser energy absorbed by a portion of the first semiconductor material film 121 on a portion of the cell area 20 may be higher than the upper limit U.L. of the absorption intensity. Thus, points at which the intensity of laser energy is greater than the upper limit U.L. of the absorption intensity may be arranged discontinuously in the portion of the cell area 20. In this case, as shown in FIG. 11, the second airgaps AG_DC may be arranged in a discrete manner between one normal cell conductive line 140N and each of the plurality of bit-line contacts 146.

The fluctuation of the laser absorption intensity due to the edge diffraction via the laser annealing process 60 using the reflective film 50 has been described. However, the above description may also be applied to the laser annealing process 60 using the anti-reflective film (70 in FIG. 27).

FIG. 35 to FIG. 38 are diagrams to illustrate an effect of an arrangement of structures on the substrate on the intensity of laser energy absorbed by the semiconductor material film.

Figure 35:
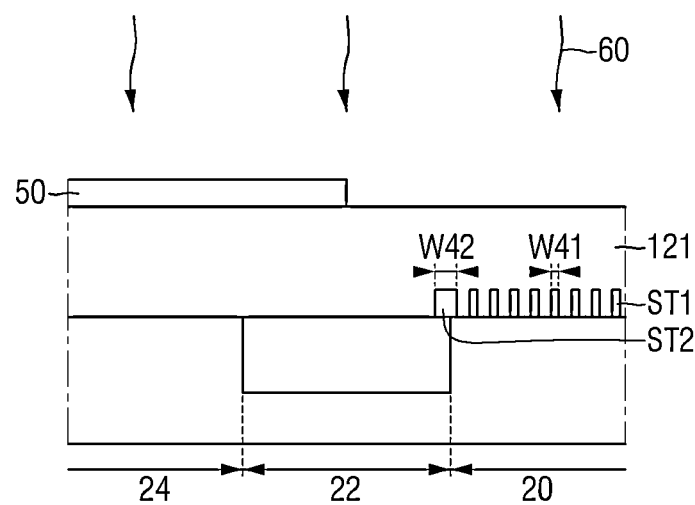
FIG. 35 to FIG. 38 are diagrams to illustrate an effect of an arrangement of structures on the substrate on the intensity of laser energy absorbed by the semiconductor material film.
Figure 37:
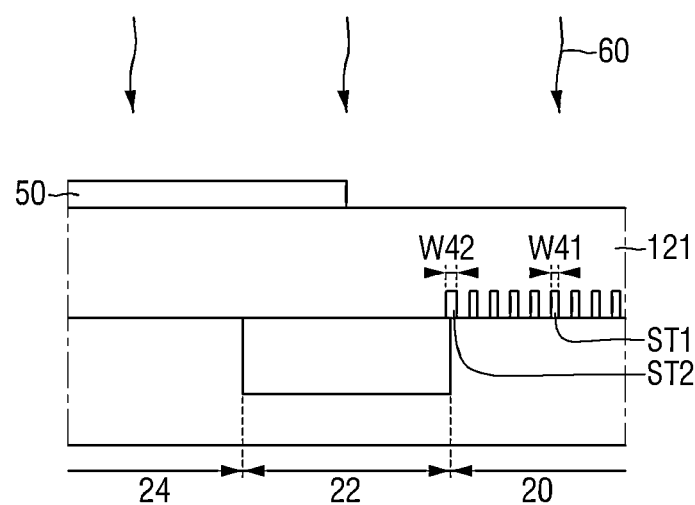

In FIG. 35 and FIG. 37, a first block structure ST1 and a second block structure ST2 may be disposed on the substrate 100 including the cell area 20, the cell area separation film 22, and the peripheral area 24. The second block structure ST2 may be a structure disposed at the outermost location of the cell area 20 among the block structures ST1 and ST2.

The first semiconductor material film 121 may be formed on the first block structure ST1 and the second block structure ST2, and then the reflective film 50 may be formed on the first semiconductor material film 121.

The first block structure ST1 may have a fourth width W41. The second block structure ST2 may have a fifth width W42. The block structures ST1 and ST2 may include one second block structure ST2 and a plurality of first block structures ST1.

The first block structures ST1 may correspond to the inner dummy cell conductive line 140DB and the normal cell conductive line 140N as described in FIG. 1 to FIG. 14. The second block structure ST2 may correspond to the outermost dummy cell conductive line 140DA.

Figure 36:
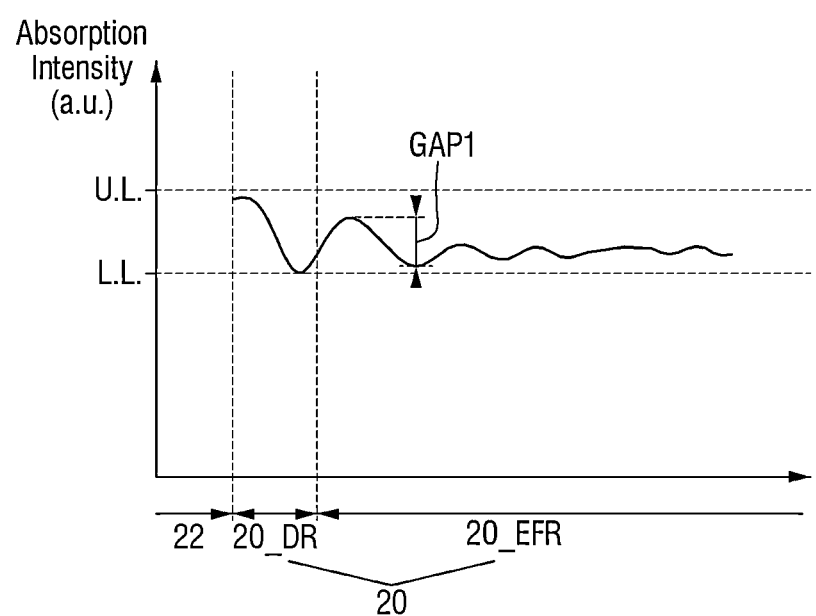
Figure 38:
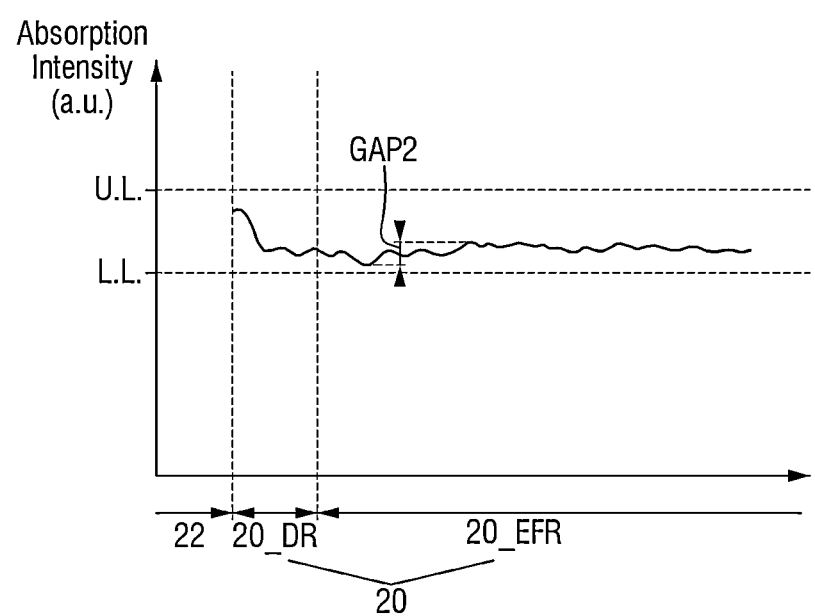

FIG. 36 and FIG. 38 are graphs showing an intensity of laser energy absorbed by a portion of the first semiconductor material film 121 on the cell area 20 in the laser annealing process 60. FIG. 36 is a graph showing an intensity of laser energy absorbed by the first semiconductor material film 121 when the block structures ST1 and ST2 as shown in FIG. 35 are arranged. FIG. 38 is a graph showing an intensity of laser energy absorbed by the first semiconductor material film 121 when the block structures ST1 and ST2 as shown in FIG. 37 are arranged.

In FIG. 36 and FIG. 38, the cell area 20 may include a dummy cell area 20_DR and an effective cell area 20_EFR. The dummy cell area 20_DR may be an area in which the dummy cell conductive lines 140DA and 140DB as described in FIG. 1 to FIG. 14 are disposed. The effective cell area 20_EFR may be an area in which the normal cell conductive line 140N as described in FIG. 1 to FIG. 14 is disposed.

In FIG. 36 and FIG. 38, the intensity of the laser energy absorbed by a portion of the first semiconductor material film 121 on the cell area 20 may be located between the upper limit U.L. of the absorption intensity and the lower limit L.L. of absorption intensity.

A ratio W42/W41 of the width W42 of the second block structure ST2 to the width W41 of the first block structure ST1 in FIG. 35 is larger than a ratio W42/W41 of the width W42 of the second block structure ST2 to the width W41 of the first block structure ST1 in FIG. 37. In FIG. 37, the ratio W42/W41 of the width W42 of the second block structure ST2 to the width W41 of the first block structure ST1 may be greater than or equal to 1.

In the effective cell area 20_EFR of FIG. 36, a difference between a maximum value and a minimum value of the intensity of laser energy absorbed by the first semiconductor material film 121 may be a first energy gap GAP1. In the effective cell area 20_EFR of FIG. 38, a difference between a local or global maximum value and a local or global minimum value of the intensity of laser energy absorbed by the first semiconductor material film 121 may be a second energy gap GAP2.

The second energy gap GAP2 in the effective cell area 20_EFR of FIG. 38 is smaller than the first energy gap GAP1 in the effective cell area 20_EFR of FIG. 36. In other words, as the ratio W42/W41 of the width W42 of the second block structure ST2 to the width W41 of the first block structure ST1 decreases, the energy gap in the effective cell area 20_EFR may decrease.

When the process condition of the laser annealing process 60 fluctuates, a probability at which the intensity of the laser energy absorbed by the first semiconductor material film 121 exceeds the upper limit U.L. of the absorption intensity or is lower than the lower limit L.L. of the absorption intensity in FIG. 36 is higher than that in FIG. 38. For example, reducing the ratio W42/W41 of the width W42 of the second block structure ST2 to the width W41 of the first block structure ST1 may allow stability and/or reliability of the manufacturing process to be improved.

The ratio W42/W41 of the width W42 of the second block structure ST2 to the width W41 of the first block structure ST1 may be greater than or equal to 1, and may be less than or equal to 2. For example, the ratio W42/W41 of the width W42 of the second block structure ST2 to the width W41 of the first block structure ST1 may be greater than or equal to 1 and may be smaller than or equal to 1.7. More preferably, the ratio W42/W41 of the width W42 of the second block structure ST2 to the width W41 of the first block structure ST1 may be greater than or equal to 1 and may be smaller than or equal to 1.5.

In another example, the description using FIG. 35 to FIG. 38 may be equally applied to the laser annealing process 60 using the anti-reflective film (70 of FIG. 27).

Although the embodiments of the present disclosure have been described in more detail with reference to the accompanying drawings, example embodiments are not necessarily limited to these embodiments. The present disclosure may be implemented in various modified manners within the scope not departing from the technical idea of the present disclosure. Accordingly, various example embodiments as disclosed are not intended to limit technical ideas of example embodiments, but to describe various examples. The scope of the technical idea of example embodiments are not limited by example embodiments. Therefore, it should be understood that the embodiments as described above are illustrative and non-limiting in all respects. The scope of protection should be interpreted by the claims, and all technical ideas within the scope should be interpreted as being included in the scope of example embodiments. Example embodiments are not necessarily mutually exclusive with one another. For example, some example embodiments may include one or more features described with reference to one or more figures, and may also include one or more other features described with reference to one or more other figures.

What is claimed is:

1. A semiconductor memory device comprising:
   a substrate having a cell area and a peripheral area defined along a periphery of the cell area, wherein the cell area includes an active area defined by a cell element separation film;
   a cell area separation film in the substrate and defining the cell area; and
   a plurality of storage contacts connected to the active area, and arranged along a first direction,
   wherein the plurality of storage contacts includes a first storage contact, a second storage contact, and a third storage contact,
   the second storage contact is between the first storage contact and the third storage contact,
   each of the first storage contact and the third storage contact defines an airgap, and
   the second storage contact is free of an airgap.

2. The semiconductor memory device of claim 1, wherein each of the first through third storage contacts includes a semiconductor material.

3. The semiconductor memory device of claim 1, further comprising:
   a storage pad; and
   an information storage element, the storage pad and the information storage element connected to each of the storage contacts.

4. The semiconductor memory device of claim 3, wherein the information storage element includes a lower electrode connected to the storage pad, a capacitor dielectric film on the lower electrode, and a plate upper electrode on the capacitor dielectric film.

5. The semiconductor memory device of claim 1, further comprising:
   a plurality of dummy bit-line groups and a plurality of normal bit-line groups, the plurality of dummy bit-line groups and the plurality of normal bit-line groups on the cell area and extending in a second direction perpendicular to the first direction,
   wherein the plurality of dummy bit-line groups are along a boundary of the cell area extending in the second direction.

6. The semiconductor memory device of claim 5, wherein the plurality of dummy bit-line groups include a first dummy bit-line closest to the peripheral area in the first direction, and a second dummy bit-line closest to the first dummy bit-line in the first direction, and
   a width in the first direction of the first dummy bit-line is greater than a width in the first direction of the second dummy bit-line.

7. The semiconductor memory device of claim 5, wherein the plurality of dummy bit-line groups include a first dummy bit-line closest to the peripheral area in the first direction, and a second dummy bit-line closest to the first dummy bit-line in the first direction, and
   a width in the first direction of the first dummy bit-line is equal to a width in the first direction of the second dummy bit-line.

8. A semiconductor memory device comprising:
   a substrate having a cell area and a peripheral area defined along a periphery of the cell area, wherein the cell area includes an active area defined by a cell element separation film;
   a cell area separation film in the substrate and defining the cell area;
   a plurality of bit-line contacts connected to the active area and arranged along a first direction; and
   a bit-line on the plurality of bit-line contacts, and extending in the first direction,
   wherein the plurality of bit-line contacts include a first bit-line contact, a second bit-line contact, and a third bit-line contact,
   the second bit-line contact is between the first bit-line contact and the third bit-line contact,
   the first bit-line contact and the bit-line have an airgap therebetween, and
   the second bit-line contact and the bit line do not have an airgap therebetween.

9. The semiconductor memory device of claim 8, wherein each of the bit-line contacts includes a semiconductor material.

10. The semiconductor memory device of claim 8, wherein the bit-line includes a semiconductor conductive line and a metallic conductive line sequentially arranged on the substrate.

11. The semiconductor memory device of claim 10, wherein each of an upper surface of the first bit-line contact and an upper surface of the third bit-line contact is lower than an upper surface of the semiconductor conductive line.

12. The semiconductor memory device of claim 8, further comprising:

a storage contact on a side of the bit-line; and an information storage element connected to the storage contact.

13. The semiconductor memory device of claim 12, wherein the information storage element includes, a lower electrode connected to a storage contact, a capacitor dielectric film on the lower electrode, and a plate upper electrode on the capacitor dielectric film.

14. A semiconductor memory device comprising:

a substrate having a cell area and a peripheral area defined along a periphery of the cell area, wherein the cell area includes an active area defined by a cell element separation film;

a cell area separation film in the substrate and defining the cell area;

a normal bit-line on the cell area and extending in a first direction;

a group of dummy bit-lines on the cell area and arranged on one side of the normal bit-line; and a plurality of storage contacts connected to the active area and arranged along a second direction perpendicular to the first direction, wherein the group of dummy bit-lines includes a first dummy bit-line closest to the peripheral area in the second direction, and a second dummy bit-line closest to the first dummy bit-line in the second direction, the first dummy bit-line extends in the first direction and has a first width in the second direction, the second dummy bit-line extends in the first direction and has a second width in the second direction, and a ratio of the first width to the second width is greater than or equal to 1, and is less than or equal to 2.

15. The semiconductor memory device of claim 14, wherein a width in the second direction of the normal bit-line is equal to the second width.

16. The semiconductor memory device of claim 14, wherein the ratio of the first width to the second width is greater than or equal to 1 and is less than or equal to 1.7.

17. The semiconductor memory device of claim 16, wherein the ratio of the first width to the second width is greater than or equal to 1 and is less than or equal to 1.5.

18. The semiconductor memory device of claim 14, wherein the group of dummy bit-lines includes at least four dummy bit-lines.

19. The semiconductor memory device of claim 14, wherein the plurality of storage contacts includes a first storage contact, a second storage contact, and a third storage contact, the second storage contact is between the first storage contact and the third storage contact, wherein each of the first storage contact and the third storage contact defines an airgap, and the second storage contact does not surround an airgap.

20. The semiconductor memory device of claim 14, further comprising:

an information storage element connected to each of the storage contacts, wherein the information storage element includes a lower electrode connected to a storage contact, a capacitor dielectric film on the lower electrode, and a plate upper electrode on the capacitor dielectric film.

* * * * *